US007602026B2

United States Patent
Horii et al.

(10) Patent No.: US 7,602,026 B2
(45) Date of Patent: Oct. 13, 2009

(54) MEMORY CELL, SEMICONDUCTOR MEMORY DEVICE, AND METHOD OF MANUFACTURING THE SAME

(75) Inventors: Shinji Horii, Fukuyama (JP); Takashi Yokoyama, Fukuyama (JP); Tetsuya Ohnishi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 422 days.

(21) Appl. No.: 11/474,414

(22) Filed: Jun. 26, 2006

(65) Prior Publication Data
US 2006/0289942 A1 Dec. 28, 2006

(30) Foreign Application Priority Data
Jun. 24, 2005 (JP) ............................. 2005-184866

(51) Int. Cl.
*H01L 23/62* (2006.01)
(52) U.S. Cl. ..................... 257/379; 257/324; 257/529; 257/E23.149; 365/158
(58) Field of Classification Search .............. 257/324, 257/379, 529, E21.209, E23.149, E29.308; 365/158
See application file for complete search history.

(56) References Cited

U.S. PATENT DOCUMENTS

| 6,204,139 | B1 | 3/2001 | Liu et al. |
| 6,911,360 | B2 * | 6/2005 | Li et al. ...................... 438/238 |
| 2004/0170052 | A1 * | 9/2004 | Inui ........................... 365/158 |
| 2005/0270821 | A1 * | 12/2005 | Nakano ....................... 365/145 |

OTHER PUBLICATIONS

Liu et al., "Electric-pulse-induced reversible resistance change effect in magnetoresistive films", Applied Physics Letters, vol. 76, No. 19, pp. 2749-2751, May 8, 2000.

* cited by examiner

*Primary Examiner*—Fernando L Toledo
(74) *Attorney, Agent, or Firm*—Nixon & Vanderhye P.C.

(57) ABSTRACT

A memory cell in a semiconductor memory device comprises a variable resistor element configured so that a variable resistor body is sandwiched between a first electrode and a second electrode, and a transistor element capable of controlling a flow of current in the variable resistor element, wherein the transistor element and the variable resistor element are placed one over the other along a direction in which the first electrode, the variable resistor body, and the second electrode of the variable resistor element are layered, and one of the first electrode and the second electrode of the variable resistor element is connected to one electrode of the transistor element.

13 Claims, 39 Drawing Sheets

MEMORY CELL, SEMICONDUCTOR MEMORY DEVICE, AND METHOD OF MANUFACTURING THE SAME

CROSS REFERENCE TO RELATED APPLICATIONS

This Nonprovisional application claims priority under 35 U.S.C. §119(a) on Patent Applications No. 2005-184866 filed in Japan on 24 Jun., 2005, the entire contents of which are hereby incorporated by reference.

BACKGROUND OF THE INVENTION

1. Field of the Invention

The present invention relates to a memory cell, and in particular, to a memory cell including a variable resistor element and a transistor element, a semiconductor memory device provided with an array of memory cells, and a method of manufacturing the same.

2. Description of the Related Art

A variety of device arrangements including FeRAM (ferroelectric RAM), MRAM (magnetic RAM), and OUM (ovonic unified memory) have been contrived as a next-generation nonvolatile random access memory (NVRAM) operable at high speed to take a place of flash memories, and there is a massive development race with respect to higher performance, higher operational reliability, lower manufacturing cost, and process matching. However, each of these memory devices that have been developed so far has its advantages and disadvantages, and realization of the ideal of a universal memory with advantages of all these SRAM, DRAM, and flash memories still remain distant.

In contrast to the prior arts, Shangquing Liu, Alex Ignatiev, and others from University of Houston, USA discloses a method of applying voltage pulses to a perovskite material, which has a super magneto-resistance effect, to reversibly modify the electrical resistance (for example, as disclosed in U.S. Pat. No. 6,204,139 and Lui, S. Q., et al. "Electric-pulse-induced reversible resistance change effect in magneto-resistive films", Applied Physics Letter, Vol. 76, pp. 2749-2751, 2000). This is a major breakthrough where a resistance change can be created in perovskite material known for the super magneto-resistance effect on the order of several digits in room temperature without application of a magnetic field.

FIG. 38 illustrates an exemplary arrangement of a memory array employing the above described advantage. This memory array is arranged where the electrode at each bit is connected with a wire line. In a writing action, pulses for writing data are applied through the wire line. For reading out the data, a current is drawn out from the wire lime.

However, because the semiconductor memory disclosed in the above U.S. Pat. No. 6,204,139 has the electrode at each bit connected with the wire line, it is difficult to increase the degree of circuitry integration as a memory while it is possible to evaluate characteristics of thin film material. In addition, as the semiconductor memory permits writing, reading, and resetting actions to be controlled by an input signal received from the outside, it fails to carry out the writing, reading, and resetting actions without the help of the external signal unlike another conventional semiconductor memory.

In addition to the semiconductor memory shown in FIG. 38, a resistive nonvolatile memory RRAM (resistance random access memory) is known using variable resistor elements with the above described advantage. Such an RRAM, unlike the MRAM, requires no magnetic fields and is low in the power consumption and relatively easy in the miniaturization and the circuitry integration. Also, since the RRAM is significantly wider in the dynamic range of the change of resistance than the MRAM, it may be implemented for multi-level storage. Moreover, its device structure is advantageously simple where a lower electrode material, a perovskite-type oxide, and an upper electrode material are deposited in layers in this order along the vertical to a substrate. In the specification of U.S. Pat. No. 6,204,139, the lower electrode material is a layer of yttrium barium copper oxide, $YBa_2Cu_3O_7$ (YBCO), deposited on a mono-crystalline substrate of lanthanum aluminum oxide, $LaAlO_3$ (LAO). The perovskite-type oxide is a layer of crystalline praseodymium calcium manganese oxide, $Pr_{1-x}Ca_xMnO_3$ (PCMO), while the upper electrode material is a layer of Ag deposited by sputtering. The action of the memory element has been reported in which its resistance can reversibly be changed by a pulse voltage of 51 volts applying at positive and negative levels to between the upper and lower electrodes. It is hence proved that a novel nonvolatile memory device is provided where the resistance can be measured during the action of reversibly changing the resistance (referred to as switching action hereinafter).

The applicants of the present invention have found from experiments of the foregoing aspect that a unique characteristic is obtained by applying a CMR featured PCMO ($Pr_{0.7}Ca_{0.3}MnO_3$) which is identical in the perovskite structure to the variable resistor body disclosed in U.S. Pat. No. 6,204,139, with one or more short electric pulses. More specifically, the resistance of the thin film material can be varied from several hundreds $\Omega$ to about one million $\Omega$ when voltage pulses of substantially ±5 V are applied.

FIG. 39 is a circuitry diagram showing an arrangement of a conventional memory array. A memory array 10 is constituted from a 4×4 matrix of variable resistor elements Rc made from a PCMO material. Each variable resistor element Rc is connected at one end to word lines W1 to W4 and at the other end to bit lines B1 to B4. A periphery circuit 32 is provided adjacent to the memory array 10. Each of the bit lines B1 to B4 is connected with a bit-path transistor 34 thus to form a path to an inverter 38. A load transistor 36 is connected between the bit-path transistor 34 and the inverter 38. Accordingly, the variable resistor elements Rc in the memory array 10 can be operated for the writing and reading of data.

In the conventional memory array, each memory element can be driven at a lower voltage. However, the disadvantage is that a passage of current leakage is developed between the memory cell to be accessed and a memory cell adjacent to the accessed memory cell during the reading action. Accordingly, this may interrupt the evaluation of current during the reading action (read disturb). Also, the current leakage to any adjacent memory cell may disturb the writing action (write disturb).

For example, in the reading action for reading the resistance from a variable resistor element Rca in a target or selected memory cell, the word line W3 is applied with a source voltage Vcc, the bit line B2 remains connected to the ground GND, and the other bit lines B1, B3, B4 and the word lines W1, W2, and W4 stay open. When the bit-path transistor 34a is switched on, a current path denoted by the arrow A1 conducts for reading the resistance. However, since the variable resistor element Rca may simultaneously develop current paths, denoted by the arrows A2 and A3, to an adjacent variable resistor element Rc, its resistance can be read out with much difficulty (the read disturb).

Moreover, in case that the external resistance across a current path connected to the variable resistor element remains not uniform, the application of voltage to the variable resistor element may fail to stay at desired levels. As the result, the writing action will be disturbed or the reading action will suffer from shortage of the current due to the inuniformity of the external resistance.

SUMMARY OF THE INVENTION

The present invention has been developed in view of the foregoing problems and its object is to provide a memory cell which has a variable resistor element arranged as a memory element of a thin film material of a perovskite structure (for example, PCMO) for operating at lower voltages while being improved in the circuitry integration and a semiconductor memory device including the memory cells. It is another object of the present invention to provide a semiconductor memory device which produces no current leakage from the memory cell to be accessed to its adjacent memory cell and a high-performance semiconductor memory device which successfully suppresses variations attributed to a memory cell.

For achievement of the above object of the present invention, a memory cell in a semiconductor memory device is provided as a first feature including a variable resistor element configured so that a variable resistor body is sandwiched between a first electrode and a second electrode, and a transistor element capable of controlling a flow of current in the variable resistor element, wherein the transistor element and the variable resistor element are placed one over the other along a direction in which the first electrode, the variable resistor body, and the second electrode of the variable resistor element are layered, and one of the first electrode and the second electrode of the variable resistor element is connected to one electrode of the transistor element.

The memory cell in a semiconductor memory device according to the present invention may be modified as a second feature in which the transistor element is a bipolar transistor, and an emitter, a base, and a collector of the bipolar transistor are layered in the same direction as the first electrode, the variable resistor body, and the second electrode of the variable resistor element are layered.

The memory cell in a semiconductor memory device of any of the above features according to the present invention may be modified as a third feature in which the variable resistor body is a metal oxide film.

The memory cell in a semiconductor memory device of the third feature according to the present invention may be modified as a fourth feature in which the variable resistor element is configured so that the variable resistor body is arranged on the second electrode and the first electrode is arranged on the variable resistor body, where the first electrode contains at least one type of material from precious metals in the platinum group metals, single metals selected from Ag, Al, Cu, Ni, Ti, and Ta or alloys of these, oxide conductors selected from Ir, Ru, Re, and Os, and oxide conductors selected from SRO ($SrRuO_3$), LSCO(($LaSr$)$CoO_3$), and YBCO($YbBa_2Cu_3O_7$).

The memory cell in a semiconductor memory device of the third or fourth feature according to the present invention may be modified as a fifth feature in which the material of the variable resistor body is a perovskite-type oxide which contains at least one type of element selected from Pr, Ca, La, Sr, Gd, Nd, Bi, Ba, Y, Ce, Pb, Sm, and Dy and at least one type of element selected from Ta, Ti, Cu, Mn, Cr, Co, Fe, Ni, and Ga.

The memory cell in a semiconductor memory device of the fifth feature according to the present invention may be modified as a sixth feature in which the perovskite-type oxide is an oxide expressed by any one of the following general formulas (where $0 \leq x \leq 1$ and $0 \leq z < 1$): $Pr_{1-x}Ca_x[Mn_{1-z}M_z]O_3$ (where M may be any element selected from Cr, Co, Fe, Ni, and Ga), $La_{1-x}AE_xMnO_3$ (where AE may be any bivalent alkaline earth metal selected from Ca, Sr, Pb, and Ba), $RE_{1-x}Sr_xMnO_3$ (where RE may be any trivalent rare earth element selected from Sm, La, Pr, Nd, Gd, and Dy), $La_{1-x}Co_x[Mn_{1-z}Co_z]O_3$, $Gd_{1-x}Ca_xMnO_3$, and $Nd_{1-x}Gd_xMnO_3$.

The memory cell in a semiconductor memory device of the third or fourth feature according to the present invention may be modified as a seventh feature in which the material of the variable resistor body is a ZnSe—Ge hetero structure oxide or an oxide which is formed so as to include at least one type of element selected from Ti, Nb, Hf, Zr, Ta, Ni, V, Zn, Sn, In, Th, Al, Pr, Ca, La, Sr, Gd, Nd, Bi, Ba, Y, Ce, Pb, Sm, Dy, Cu, Mn, Cr, Co, Fe, and Ga.

The memory cell in a semiconductor memory device of any of the third to seventh features according to the present invention may be modified as an eighth feature in which the second electrode includes at least one type of material from single precious metals in the platinum group metals, alloys based on the precious metal, oxide conductors selected from Ir, Ru, Re, and Os, silicide conductors of an element selected from Ti, Ni, Co, Pt, and W, and oxide conductors selected from SRO ($SrRuO_3$), LSCO(($LaSr$)$CoO_3$), and YBCO($YbBa_2Cu_3O_7$).

The memory cell in a semiconductor memory device of any of the preceding features according to the present invention may be modified as a ninth feature in which the variable resistor element is positioned by self-alignment and connected to one electrode of the transistor element.

According to the memory cell of the preceding features, the transistor element and the variable resistor element are placed one over the other in the direction equal to the layer arrangement of the first electrode, the variable resistor body, and the second electrode in the variable resistor element while either the first electrode or the second electrode of the variable resistor element is connected with one electrode of the transistor element. As the result, the memory cell can be minimized in the overall size, thus contributing to the greater storage capacity of the semiconductor memory device. Particularly, when arranged in layers vertical to its substrate, the memory cell can be downsized to a level equal to the size of a memory cell which includes a variable resistor element but not a transistor element.

Since the memory includes the variable resistor element of which the variable resistor body is sandwiched between the first electrode and the second electrode, its switching ratio can be improved thus increasing a margin for the reading action. Also, as its memory cell according to the preceding features of the present invention is composed mainly of the variable resistor element and the transistor element, the semiconductor memory device can be simple in the construction and high in the storage capacity. Moreover, as its transistor element is capable of controlling in both directions the flow of current in the variable resistor element, the memory cell can suppress current leakage to its adjacent memory cell regardless of the direction of the current flow. When its variable resistor element has been positioned by self-alignment and connected to one electrode of the transistor element, the memory cell can be minimized in the variation of characteristics.

For achievement of the object, a semiconductor memory device according to the present invention is provided as a tenth feature including a memory array which has the memory cells, according to any of the above described features of the present invention, arranged in a matrix of rows and columns on a semiconductor substrate, wherein the transistor element in the memory cell is a bipolar transistor, the memory cell is configured so that one of the first electrode and the second electrode of the variable resistor element is connected to one of the emitter and the collector of the bipolar transistor, and, the memory array is configured so that the other of the emitter and the collector of the bipolar transistor in each memory cell of each column is connected to a common source line which extends along the column, the base of the bipolar transistor in each memory cell of each row is connected to a common word line which extends along the row, and the other of the first electrode and the second electrode of the variable resistor element in each memory cell of each column is connected to a common bit line which extends along the column.

The semiconductor memory device according to the present invention may be modified as an eleventh feature in which the source line is formed by a stripe of p-type or n-type semiconductor layer deposited on the semiconductor substrate, the word line is formed by a stripe of semiconductor layer with the different conduction type from the source line which is deposited over the source line, and the base/emitter junction or the base/collector junction of the bipolar transistor of each of the memory cells is formed on the contact surface of the source line and the word line at the intersection of the source line and the word line.

The semiconductor memory device according to the present invention may be modified as a twelfth feature in which one of the emitter and the collector of the bipolar transistor which is connected with either the first electrode or the second electrode of the variable resistor element in each of the memory cells is formed by a semiconductor layer with the same conduction type as the source line which is deposited on the word line at the intersection of the source line and the word line, the variable resistor element in each of the memory cells is formed above the one of the emitter and the collector of the bipolar transistor which is connected with either the first electrode or the second electrode of the variable resistor element at each of the intersection of the source line and the word line, and the bit line is formed above the variable resistor element.

The semiconductor memory device according to the present invention may be modified as a thirteenth feature in which the variable resistor element in each of the memory cells is formed by self-alignment above the one of the emitter and the collector of the bipolar transistor which is connected with either the first electrode or the second electrode of the variable resistor element at the intersection of the source line and the word line, and the bit line is formed above the variable resistor element.

The semiconductor memory device of the twelfth or thirteenth feature according to the present invention may be modified as a fourteenth feature in which the bit line is connected to variable resistor element with a contact electrically connected by self-alignment to the variable resistor element.

The semiconductor memory device of any of the preceding features according to the present invention may be modified as a fifteenth feature in which electrodes of the bipolar transistor and the first electrode, the variable resistor body, and the second electrode of the variable resistor element are place one over another in a direction vertical to a surface of the semiconductor substrate.

Accordingly, the semiconductor memory device according to the present invention includes the advantages of the memory cell disclosed as each of the preceding features of the present invention. More specifically, the semiconductor memory device according to the present invention can be increased in the storage capacity, minimized in the development of current leakage between any two adjacent memory cells, and operated at lower voltages. In particular, when the variable resistor element and the transistor element have been connected to each other by a self-alignment technique, their characteristics remain low in the variation.

For achievement of the above object of the present invention, a method of manufacturing a semiconductor memory device which is defined by any of the preceding features is provided including the steps of forming element isolation regions on a semiconductor substrate, forming a first semiconductor layer which turns to the source line between the element isolation regions, depositing on the first semiconductor layer and the element isolation regions a second semiconductor layer a portion of which turns to the word line and a third semiconductor layer a portion of which turns to the one of the emitter and the collector of the bipolar transistor which is connected to either the first electrode or the second electrode, patterning a portion of the third semiconductor layer, patterning the remaining of the third semiconductor layer and the second semiconductor layer, and forming either the first electrode or the second electrode and the variable resistor body on the third semiconductor layer after the two patterning steps.

The method of manufacturing a semiconductor memory device according to the present invention may be modified in which at least a portion of the second semiconductor layer is arranged of a polycrystalline silicon film.

The method of manufacturing a semiconductor memory device according to the present invention may be modified in which both the second semiconductor layer and the third semiconductor layer are arranged of am epitaxial silicon film.

The method of manufacturing a semiconductor memory device according to the present invention may further includes steps of, after the deposition of the first, second, and third semiconductor layers, injecting impurities into each of the three semiconductor layers by ion implantation of impurities.

The method of manufacturing a semiconductor memory device according to the present invention may be modified in which the source lines are patterned using a first photoresist mask, the word lines are patterned using a second photoresist mask, and the one of the emitter and the collector of the bipolar transistor which is connected to either the first electrode or the second electrode of the variable resistor element is patterned using the second photoresist mask and a third photoresist mask.

The method of manufacturing a semiconductor memory device according to the present invention may be modified in which, after the two patterning steps, the third semiconductor layer is etched back thus to develop spaces in an insulating layer deposited around the third semiconductor layer, the spaces are then filled with either of the first electrode or the second electrode and the variable resistor body, and either of the first electrode or the second electrode is connected by self-alignment to the third semiconductor layer.

Since the method of manufacturing a semiconductor memory device according to the present invention allows the transistor element and the variable resistor element to be placed one over the other in a direction vertical to the semiconductor substrate, the memory cells in the semiconductor memory device can be improved in the circuitry integration. As the result, the semiconductor memory device can be increased in the storage capacity while decreased in the manufacturing cost. Particularly, the variable resistor element is formed on the third semiconductor layer by self-alignment after the patterning process and can thus be minimized in the variation of characteristics between the memory cells.

DETAILED DESCRIPTION OF THE INVENTION

A memory cell for a semiconductor memory device, a semiconductors memory device (hereinafter referred to as the inventive device, as appropriate), and a method of manufacturing the semiconductor memory device (hereinafter referred to as the inventive method) according to the present invention will be described referring to the relevant drawings.

The inventive method is based on providing a thin film of a CMR material (such as PCMO, $Pr_{0.7}Ca_{0.3}MnO_3$) which acts as a variable resistor body and can be changed in the resistance by approximately two digits upon receiving low voltage pulses and a current control element for controlling the current which flows in the variable resistor body thus to develop each memory cell and thus a memory array which are then driven for writing, reading, and resetting actions.

The memory cell according to the present invention includes a variable resistor element having a variable resistor body sandwiched between two, first and second, electrodes, and a transistor element (selector transistor) for controlling the current in the variable resistor element. The transistor element and the variable resistor element are placed one over the other in a direction equal to the layer arrangement of the first electrode, the variable resistor body, and the second electrode in the variable resistor element. Either the first or second electrode of the variable resistor element is connected to one electrode of the transistor element. The memory cell may employ PCMO as the material of the variable resistor body of a thin film form. As the selector transistor acting as the current control element, for example, an NPN-type junction bipolar transistor (hereinafter simply referred to as a bipolar transistor) is used. Note that the current control element may be an PNP-type junction bipolar transistor, an N-type MOSFET, a P-type MOSFET, or any element capable of conducting a switching action.

Figure 1:
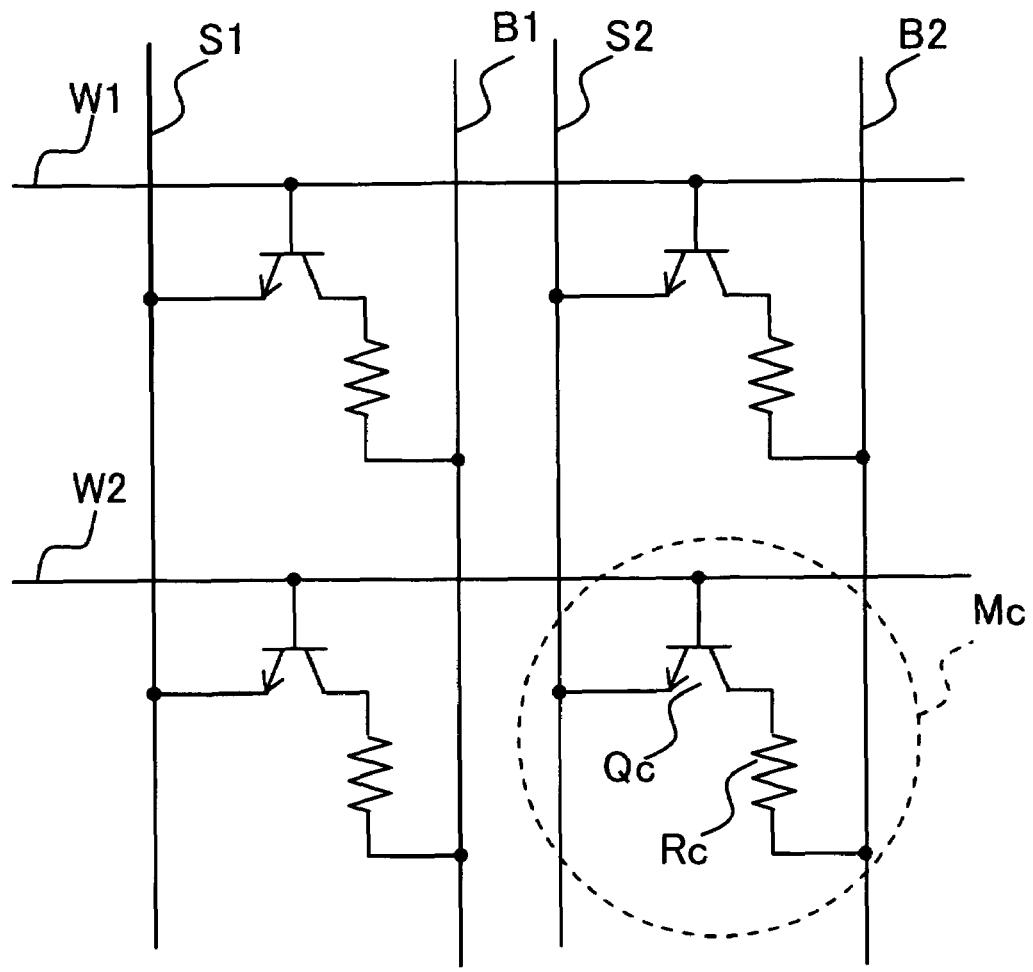
FIG. 1 is an equivalent circuitry diagram showing an arrangement of memory cells or a memory array in a semiconductor memory device according to the present invention.
Figure 2:
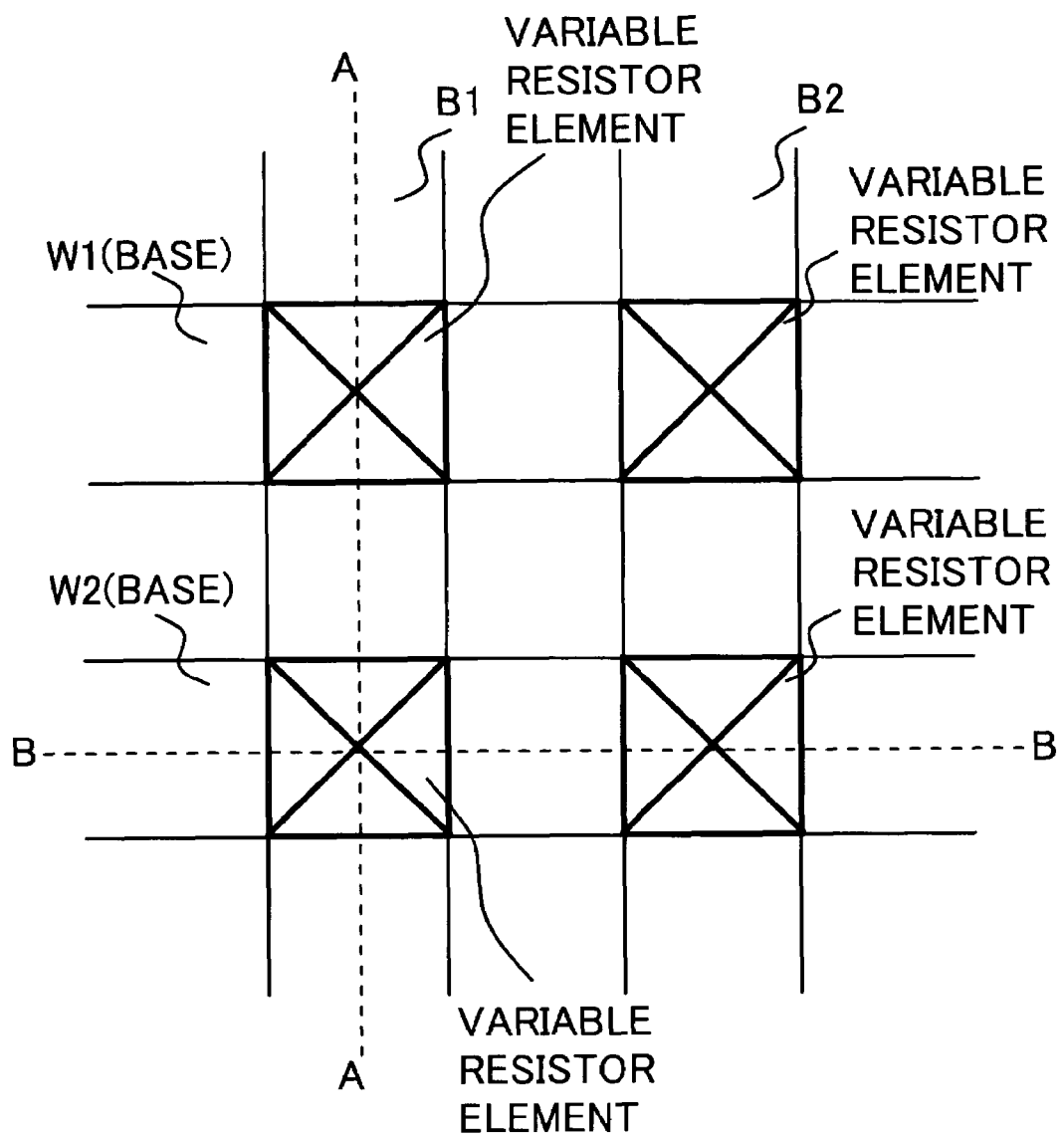
FIG. 2 is a layout diagram showing the memory cells or the memory array in the semiconductor memory device according to the present invention.
Figure 30A:
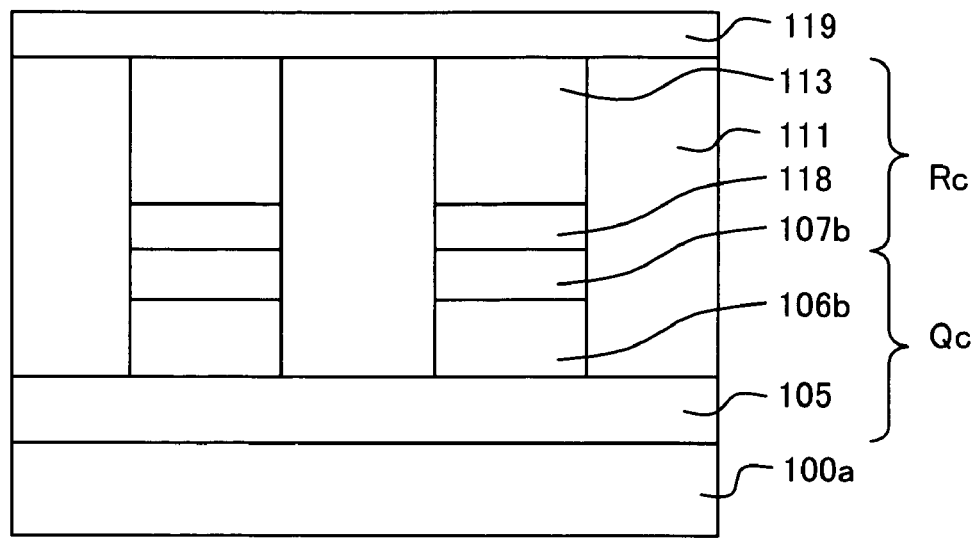
FIG. 30A and FIG. 30B are cross sectional views showing an arrangement of memory cells or a memory array in another semiconductor memory device according to the present invention.
Figure 30B:
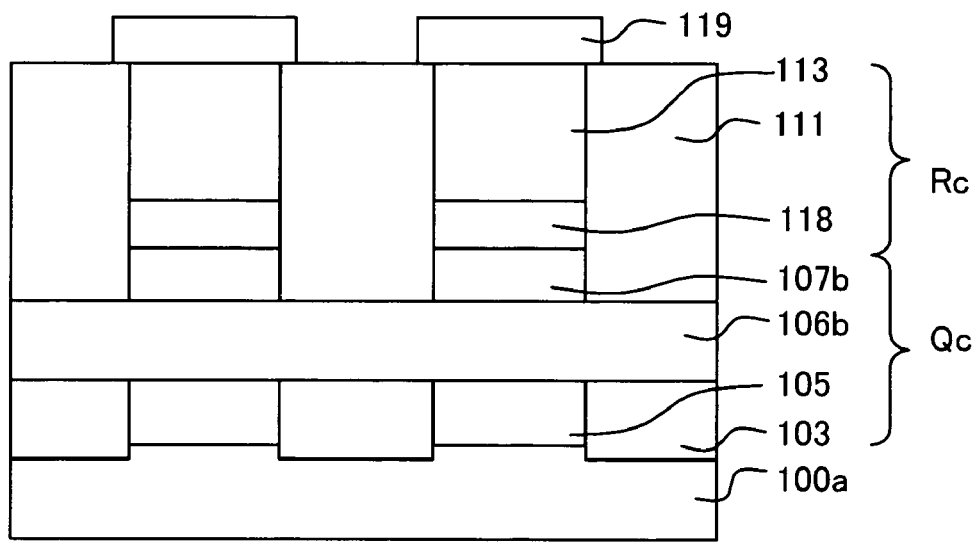
Figure 33:
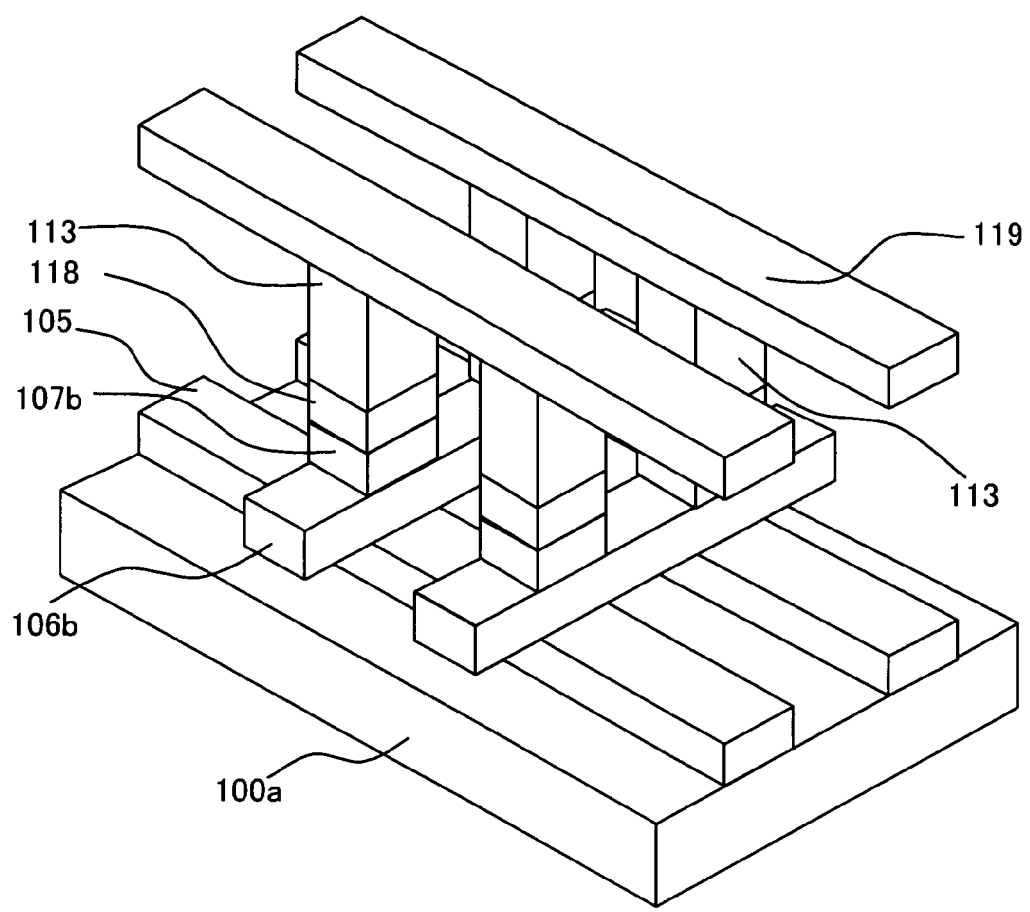
FIG. 33 is a perspective view showing an arrangement of the memory array in the semiconductor memory device according to the present invention.

FIG. 1 is an equivalent circuitry diagram showing a memory array composed of a 2×2 matrix of memory cells Mc of the present invention. FIG. 2 is a schematic plan view of the memory array shown in FIG. 1. FIG. 30A is a schematically cross sectional view taken along the line A-A of FIG. 2 and FIG. 30B is a schematically cross sectional view taken along the line B-B of FIG. 2. FIG. 33 is a perspective view of the memory array shown in FIGS. 1 and 2.

As shown in FIG. 1, the memory cell Mc has the variable resistor element Rc connected at one end to one of the emitter and the collector of the bipolar transistor Qc (the collector in FIG. 1). In the memory array, the memory cells Mc of each column are connected at the other of the emitter and collector (the emitter in FIG. 1) of their bipolar transistor Qc to one of common source lines which extend along the columns as denoted by S1, S2, and so on. The memory cells Mc of each row are connected at the base of their bipolar transistor Qc to one of common word lines which extend along the rows as denoted by W1, W2, and so on. Equally, the memory cells Mc of each column are connected at the other end of their variable resistor element Rc to one of common bit lines which extend along the columns as denoted by B1, B2, and so on.

Referring to the schematic plan view of FIG. 2, the source lines S1 and S2 are provided beneath the bit lines B1 and B2 respectively (not shown). Also, the bipolar transistors (not shown) are provided beneath the variable resistor elements.

FIG. 30 illustrates schematically an exemplary arrangement of the memory array. In the memory cell Mc of the present invention shown in FIG. 30, the emitter, the base, and the collector of the bipolar transistor Qc are placed one over another along the direction equal to the layer arrangement of the variable resistor element Rc. The variable resistor element Rc includes a first electrode 119, a second electrode 118, and a variable resistor body 113 sandwiched between the first electrode 119 and the second electrode 118. In particular, the variable resistor body 113 remains buried to be flush with an insulating layer 111. The second semiconductor layer developing the bipolar transistor Qc may be a polycrystalline silicon layer.

More specifically, as shown in FIG. 33, the source lines 105 of n-type silicone is patterned on a semiconductor substrate or namely p-type silicon substrate 100a and the word lines 106b of p-type silicon is patterned to be arranged at a right angle to the source lines 105. With its (collector) electrode 107b of n-type silicon deposited just above the intersection of each source line 105 and each word line 106*b*, the bipolar transistor Qc is provided as the current control element. Then, the second electrode 118 and the variable resistor body 113 are deposited on the collector 107*b* to seat one over the other along the direction of the layer arrangement of the emitter, the base, and the collector of the bipolar transistor Qc. Finally, the first electrode 119 is deposited as the bit line directly on the variable resistor body 113 to complete the memory cell Mc. In brief, the emitter of the bipolar transistor Qc is provided on the source line 105 at its intersection with the word line 106*b* while the base of the bipolar transistor Qc is deposited on the word line 106*b* at its intersection with the source line 105. This allows the base/emitter junction in the bipolar transistor to be developed between the source line 105 and the word line 106*b*.

As each memory cell Mc composed of the bipolar transistor Qc and the variable resistor element Rc connected in series with each other is vertically developed at the intersection of one of the word lines W1, W2 and one of the bit lines B1, B2, it is possible to realize a large degree of miniaturization.

Although not shown, the word lines W1, W2, . . . are connected with a row decoder and a word line driver circuit for selecting and feeding the word line with a voltage to drive a selected memory cell connected thereto to conduct a desired memory action (such as writing, reading, and resetting actions, as described later) while the bit lines B1, B2, . . . are connected with a column decoder and a bit line driver circuit for selecting and feeding the bit line with a voltage to drive the selected memory cell connected thereto to conduct the desired memory action. In addition, a readout circuit is provided for reading a data from the selected memory cell via the bit line selected, thus completing a semiconductor memory device according to the present invention. The row decoder, the word line driver circuit, the column decoder, the bit line driver circuit, and the readout circuit are fabricated in known circuitry arrangements which are commonly used in conventional nonvolatile semiconductor memory devices and will be explained in no more detail.

Preferably, the material of the first electrode 119 may contain at least one type of material from precious metals in the platinum group metals, single metals selected from Ag, Al, Cu, Ni, Ti, and Ta or alloys of these, oxide conductors selected from Ir, Ru, Re, and Os, and oxide conductors selected from SRO(SrRuO$_3$), LSCO((LaSr)CoO$_3$), and YBCO (YbBa$_2$Cu$_3$O$_7$). The material is not limited to the foregoing materials so long as the desired characteristics can be obtained.

The material of the variable resistor body 113 may preferably be a perovskite-type oxide which contains at least one type of element selected from Pr, Ca, La, Sr, Gd, Nd, Bi, Ba, Y, Ce, Pb, Sm, and Dy and at least one type of element selected from Ta, Ti, Cu, Mn, Cr, Co, Fe, Ni, and Ga. The perovskite-type oxide is an oxide expressed by any one of the following general formulas (where $0 \leq x \leq 1$ and $0 \leq z < 1$): $Pr_{1-x}Ca_x[Mn_{1-z}M_z]O_3$ (where M may be any element selected from Cr, Co, Fe, Ni, and Ga), $La_{1-x}AE_xMnO_3$ (where AE may be any bivalent alkaline earth metal selected from Ca, Sr, Pb, and Ba), $RE_{1-x}Sr_xMnO_3$ (where RE may be any trivalent rare earth element selected from Sm, La, Pr, Nd, Gd, and Dy), $La_{1-x}Co_x[Mn_{1-z}Co_z]O_3$, $Gd_{1-x}Ca_xMnO_3$, and $Nd_{1-x}Gd_xMnO_3$. Alternatively, the material of the variable resistor body 113 may be a ZnSe—Ge hetero structure oxide or an oxide which is formed so as to include at least one type of element selected from Ti, Nb, Hf, Zr, Ta, Ni, V, Zn, Sn, In, Th, Al, Pr, Ca, La, Sr, Gd, Nd, Bi, Ba, Y, Ce, Pb, Sm, Dy, Cu, Mn, Cr, Co, Fe, and Ga so long as the desired variable resistive characteristics can be obtained.

The material of the second electrode 118 may contain at least one type of material from precious metals in the platinum group metals, alloys based on the precious metal, oxide conductors selected from Ir, Ru, Re, and Os, silicide conductors of an element selected from Ti, Ni, Co, Pt, and W, and oxide conductors selected from SRO(SrRuO$_3$), LSCO((LaSr)CoO$_3$), and YBCO(YbBa$_2$Cu$_3$O$_7$).

Respective actions of the memory array will now be described. In the following explanation, it is assumed that while the resistance of the variable resistor element Rc is as high as substantially 1 MΩ before the writing of data, the potential difference to be supplied to the variable resistor element Rc is about 2 V for changing the resistance of the variable resistor element Rc.

(Writing Action)

Referring to FIG. 1, the writing action to the memory cell of the present invention (through declining the resistance of the variable resistor element Rc in the memory cell Mc) will be explained. When the memory array remains at the inactive state (pre-charged state), all the bits lines, the word lines, and the source lines are applied with 0 V (equal to the grounding GND level).

The bit line B2 connected to the variable resistor element Rc in the selected memory cell Mc is applied with, for example, 3 V. The other bit lines B1 is applied with 0 V. Simultaneously, the source line S2 acting as the emitter of the bipolar transistor Qc is applied with 0 V. When the word line W2 connected with the base of the bipolar transistor Qc in the selected memory cell Mc is applied with 0.5 V, the junction between the emitter and the base is turned to a forward bias condition and the junction between the base and the collector is turned to a reverse bias condition. More particularly, a signal of an amplified level (the corrector current) is induced by the word line W2 applied with a relatively small amplitude signal (the base current). This allows the variable resistor element Rc to be supplied with a potential needed for changing its resistance. Accordingly, the resistance drops down to 50 kΩ. As the source line S1 and the word line W1 connected with an unselected memory cell are applied with 0 V, the bipolar transistor in the unselected memory cell remains not conducted. The selected memory cell Mc is written by carrying out the above steps.

As described, the setting of each potential can avoid an error action (write disturbing action) of writing a memory cell next to the selected memory cell Mc. The direction of the voltage application can be altered depending on the material and structure of the variable resistor body and the first and second electrodes. This is equally applied to the following reset actions 1 and 2.

(Resetting Action 1)

When the memory array remains at the inactive state (pre-charged state), all the bits lines, the word lines, and the source lines are applied with 0 V (equal to the grounding GND level) similar to the writing action. For resetting the resistance of the variable resistor element Rc in the selected memory cell Mc, the bit line B2 connected to the variable resistor element Rc in the selected memory cell Mc is load with, for example, 0 V. Simultaneously, the other bit line B1 is fed with 3 V. Also, both the source line S2 acting as the emitter of the bipolar transistor Qc and the unselected source line S1 are applied with 3 V. When the word line W2 connected with the base of the bipolar transistor Qc in the selected memory cell Mc is applied with, for example, 0.5 V, the bias condition between the emitter and the collector is reversed from those at the writing action. This allows the variable resistance element Rc to be supplied with a potential needed for changing the resistance, thus returning back the resistance of the variable resistor element Rc to 1 MΩ. As the word line W1 connected with an unselected memory cell is applied with 0 V, the bipolar transistor in the unselected memory cell remains not conducted. The selected memory cell Mc is reset to cancel the data by carrying out the above steps.

(Resetting Action 2)

When the memory array remains at the inactive state (pre-charged state), all the bits lines, the word lines, and the source lines are applied with 0 V (equal to the grounding GND level) similar to those of the writing action. For resetting the resistance of the variable resistor element Rc in each of memory cells connected with the activated word line W2, the bit line B2 connected to the variable resistor element Rc in the selected memory cell is load with, for example, 0 V. Simultaneously, the other bit line B1 is fed with 0 V. Also, both the source line S1 and S2 acting as the emitter of the bipolar transistor Qc are turned to an open mode. When the word line W2 is applied with, for example, 3 V, the junction between the base and the collector is turned to a forward bias condition. This allows the variable resistance element Rc to be supplied with a potential needed for changing the resistance, thus returning back the resistance of the variable resistor element Rc to 1 MΩ. As the word line W1 connected with an unselected memory cell is applied with 0 V, the bipolar transistor in the unselected memory cell remains not conducted. The memory cells connected to the activated word line W2 all are reset to cancel the data by carrying out the above steps.

While the resistor element in each memory cell connected to the activated word line W2 remains at the initial (reset) state having a high resistance of about 1 MΩ and permits no current to run through, the resistor element remaining at a low resistance of 50 kΩ for the writing action selectively allows a current to run through, hence making the reset action efficient.

Also, since the bit line B1 is fed with 3 V, its connected memory cell remains not activated thus allowing the selected memory cell Mc to be reset on the bit-by-bit basis.

During the reset action, the current flows mainly to the resistor element at the lower resistance thus minimizing the power consumption. Moreover, as each block of the memory cells arranged to be subjected concurrently to the reset action is increased in the storage size, their resetting action speed will be improved.

(Resetting Action 3)

When the memory array remains at the inactive state (pre-charged state), all the bits lines, the word lines, and the source lines are applied with 0 V (equal to the grounding GND level) similar to those of the writing action. For resetting the resistance of the variable resistor element Rc in the selected memory cell Mc, the bit line B2 connected to the variable resistor element Rc in the selected memory cell Mc is applied with, for example, 3 V. Simultaneously, the other bit line B1 is applied with 0 V. Also, both the source line S2 acting as the emitter of the bipolar transistor Qc and the not activated source line S1 are applied with 0 V. When the word line W2 connected to the base of the bipolar transistor Qc in the selected memory cell Mc is applied with, for example, 0.5 V, the bias condition between the emitter and the collector are shifted to the same condition as those at the writing action. This allows the variable resistance element Rc to be supplied with a potential needed for changing the resistance, thus returning back the resistance of the variable resistor element Rc to 1 MΩ. As the word line W1 connected with an unselected memory cell is applied with 0 V, the bipolar transistor in the unselected memory cell remains not conducted. The selected memory cell Mc only is reset to cancel the data by carrying out the above steps.

Although the reset action 3 is carried out with the same bias condition as that at the writing action, the pulse length needs not to be equal to that of the writing action. It is preferable, for example, that with the variable resistor body made of Ni oxide, the voltage pulse length for the writing action is 10 nsec while the voltage pulse length for the reset action is 5 μsec.

(Reading Action)

When the memory array remains at the inactive state (pre-charged state), all the bits lines, the word lines, and the source lines are applied with 0 V (equal to the grounding GND level) similar to those of the writing action.

Then, the source line S2 connected to the selected memory cell Mc is applied with 0 V while the bit line B2 is applied with, for example, 1.2 V. Simultaneously, the word line W2 connected to the base of the bipolar transistor Qc in the selected memory cell Mc is applied with 0.05 V. At the time, the potential difference between two ends of the variable resistor element Rc in the selected memory cell Mc remains as small as 0.5 V to 1 V, thus permitting no change in the resistance.

Also, the other word lines remain at the pre-charged state or applied with 0 V. All the bit lines are applied with 0 V excluding the bit line B2 connected to the selected memory cell Mc. This allows the variable resistor element Rc in each unselected memory to have no potential difference between its two ends, hence creating no change in the resistance.

As the result, a current path is developed extending from the bit line B2 across the selected memory cell Mc to the source line S2, thus conducting the reading action. Simultaneously, since the current running the path corresponds to the resistance of the variable resistor element Rc, it can examine the level of data between "1" and "0". More particularly, it can identify whether the level of data saved in the memory cell Mc is "1" or "0" for conducting the reading action.

The greater the ratio of the resistance of the variable resistor element Rc to the entire resistance of the current path in the memory cell Mc, the more the reading action will be improved.

The row decoder and the column decoder (both not shown) are provided for generating a signal to select a memory cell as located at the periphery of the memory array. The row decoder is connected with the bit lines while the column decoder is connected with the word lines. For reading the data from the memory cell, the bit lines B1 and B2 are connected to the read-out circuit via the memory cell and the bit lines. The read-out circuit is also located at the periphery of the memory array.

Embodiments of apparatus of the present invention to be fabricated by the inventive method will now be described referring to the relevant drawings.

First Embodiment

This embodiment will be described in the form of a semiconductor memory device where a second semiconductor layer and a third semiconductor layer are epitaxial silicon layers, referring to FIGS. 3 to 17. Each drawing denoted by the letter A represents a cross sectional view taken along the line A-A of a plan view of the memory array of FIG. 2 while each drawing denoted by the letter B is a cross sectional view taken along the line B-B of the same.

A silicon oxide layer 101 is deposited to a thickness of 10 to 100 nm as a mask layer on the surface of a p-type silicon substrate 100 which acts as the semiconductor substrate. Then, a silicon nitride layer 102 is deposited to a thickness of 50 to 500 nm. With a first resist mask 001 having been patterned over by a known photolithography manner (See FIG. 3), a reactive ion etching process is conducted to etch the silicon nitride layer 102 and the silicon oxide layer 101 in a sequence.

The p-type silicon substrate 100 is then modified to a p-type silicon substrate 100a which has stripes of groove at a depth of 100 to 1000 nm (See FIG. 4), using stripe patterns of silicon nitride layer 102a and silicon oxide layer 101a as the masks. The grooves may be formed using the resist mask 001. The masking may be implemented by a desired pattern of insulating layer or conductive layer other than the silicon oxide layer and the silicon nitride layer.

This is followed by filling the grooves with insulators or namely silicon oxide layers 103 which act as element isolation regions (See FIG. 5) with a CMP (chemical mechanical polishing) process. Then, a p-type epitaxial silicon layer 104 is deposited to a thickness of 1 to 10 μm on the p-type silicon substrate 100a and the silicon oxide layers 103. It is desired that the epitaxial silicon layer 104 is deposited at its impurity volumetric density arranged as low as $10^{15}$ to $10^{18}/cm^3$ (See FIG. 6).

Next, a first semiconductor layer 105 (acting as the source line and the emitter of a selected transistor) is developed as an n-type impurity layer by, e.g., ion injection between any two adjacent silicon oxide layers 103 filling the grooves of the p-type silicon substrate 100a. It is desired that the n-type first semiconductor layer 105 is developed at its impurity volumetric density of $10^{16}$ to $10^{20}/cm^3$. Then, a second semiconductor layer 106 (turned by another patterning process to the word line and the base of the selected transistor) and a third semiconductor layer 107 (turned by the another patterning process to the collector of the selected transistor) are deposited as a p-type silicon impurity layer and an n-type silicon impurity layer respectively on the first semiconductor layer 105 also by ion injection (See FIG. 7). It is desired that the p-type second semiconductor layer 106 and the n-type third semiconductor layer 107 are deposited at their impurity volumetric density of $10^{16}$ to $10^{19}/cm^3$ and $10^{16}$ to $10^{20}/cm^3$ respectively. So long as the first, second, and third semiconductor layers 105, 106, and 107 are optimized in the profile of impurity density corresponding to the target voltage specifications of the bipolar transistor in each memory cell, the order of their developments will be not restricted.

Figure 9A:
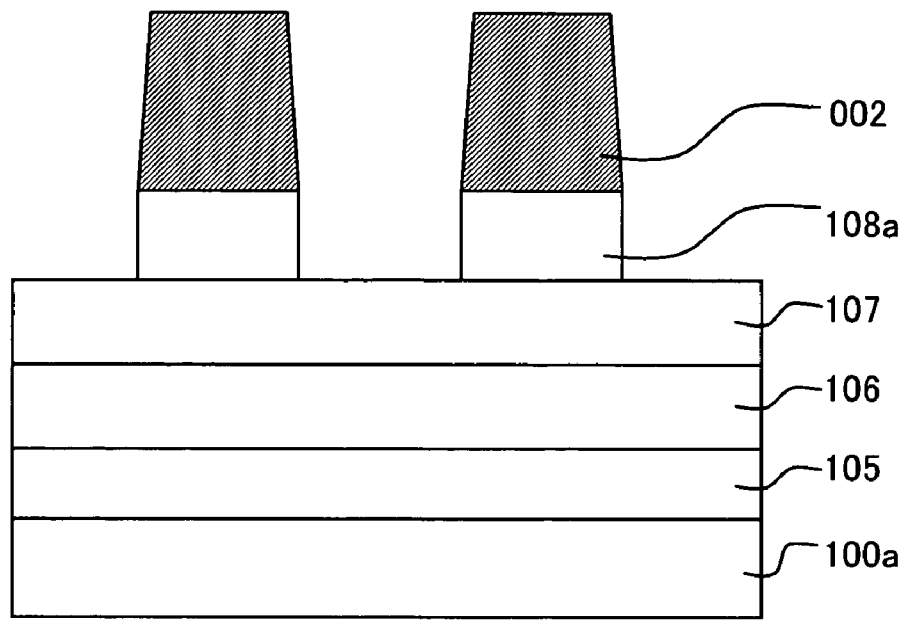
FIG. 9A and FIG. 9B are cross sectional views at a still further step of fabricating the memory cells or the memory array in the method of manufacturing a semiconductor memory device showing the first embodiment of the present invention.
Figure 9B:
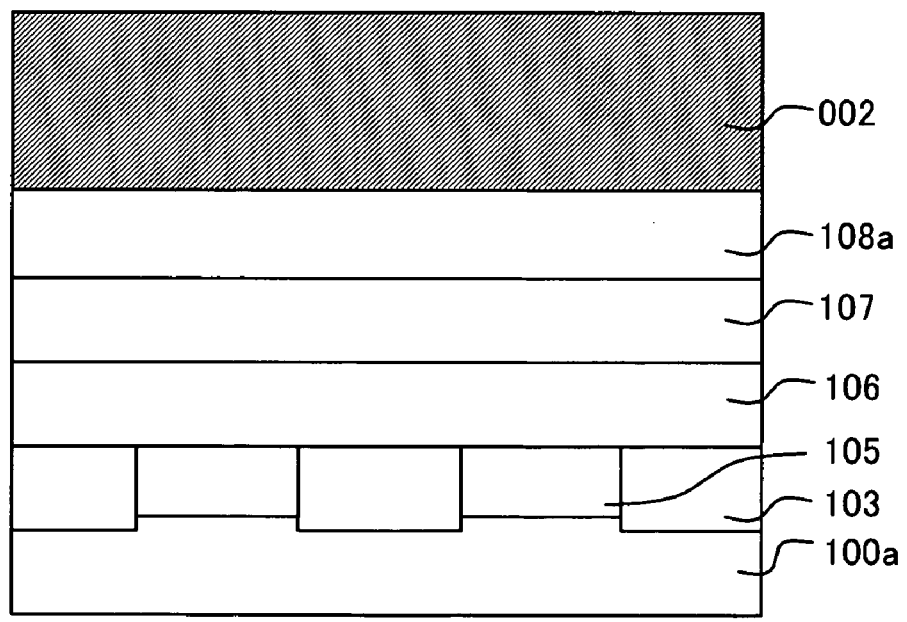

This is followed by depositing, for example, a silicon nitride layer 108 to a thickness of 100 to 1000 nm on the epitaxial silicon layer, providing a pattern of second resist masks 002 with a known photolithography process (See FIG. 8), and subjecting the silicon nitride layer 108 to a reactive ion etching process for developing a stripe pattern (See FIG. 9).

Figure 10A:
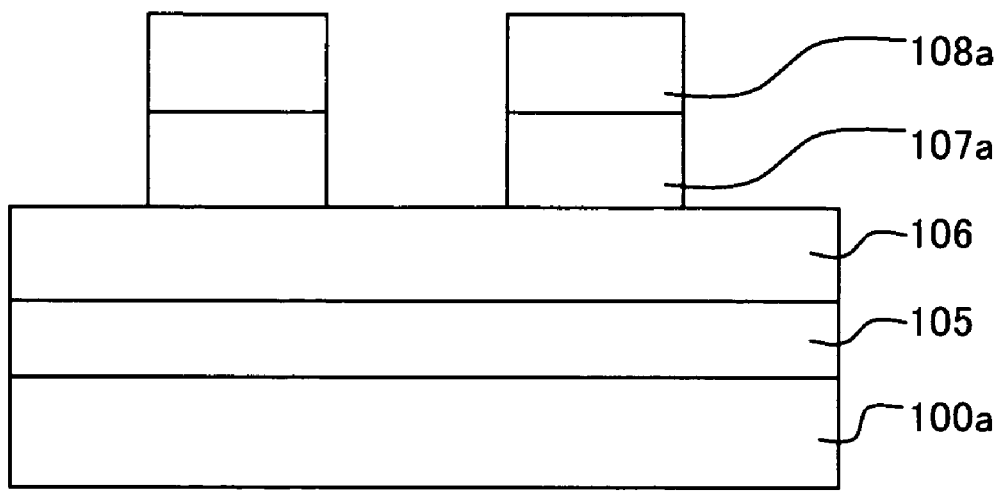
FIG. 10A and FIG. 10B are cross sectional views at a still further step of fabricating the memory cells or the memory array in the method of manufacturing a semiconductor memory device showing the first embodiment of the present invention.
Figure 10B:
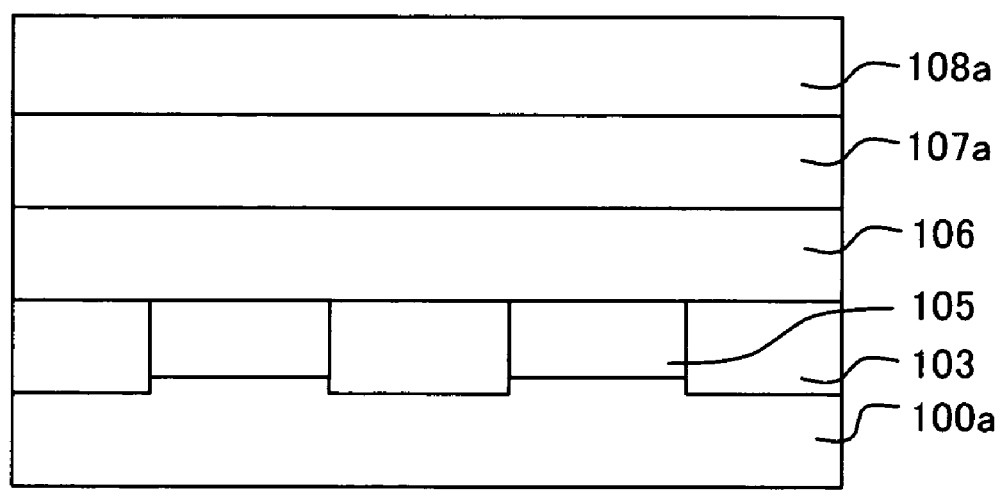
Figure 11A:
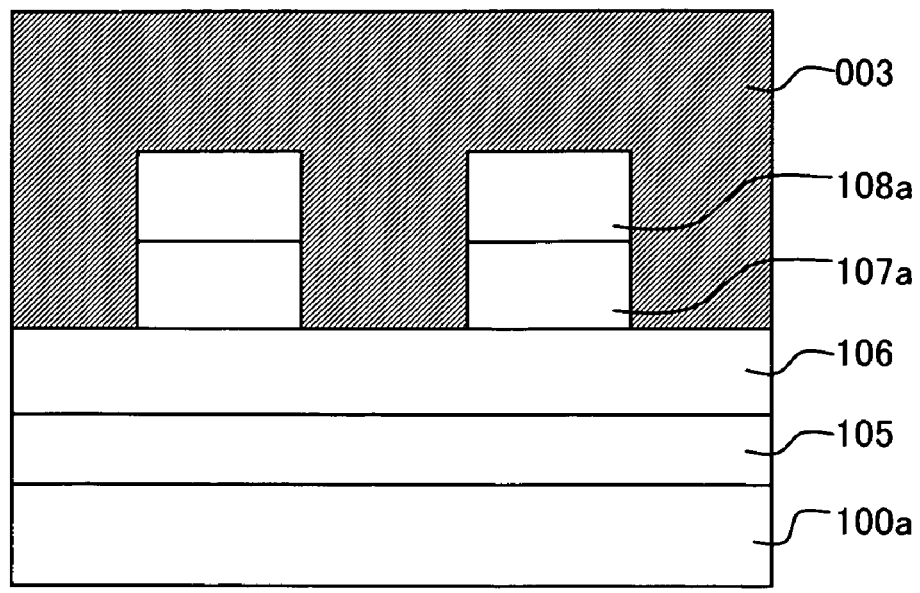
FIG. 11A and FIG. 11B are cross sectional views at a still further step of fabricating the memory cells or the memory array in the method of manufacturing a semiconductor memory device showing the first embodiment of the present invention.
Figure 11B:
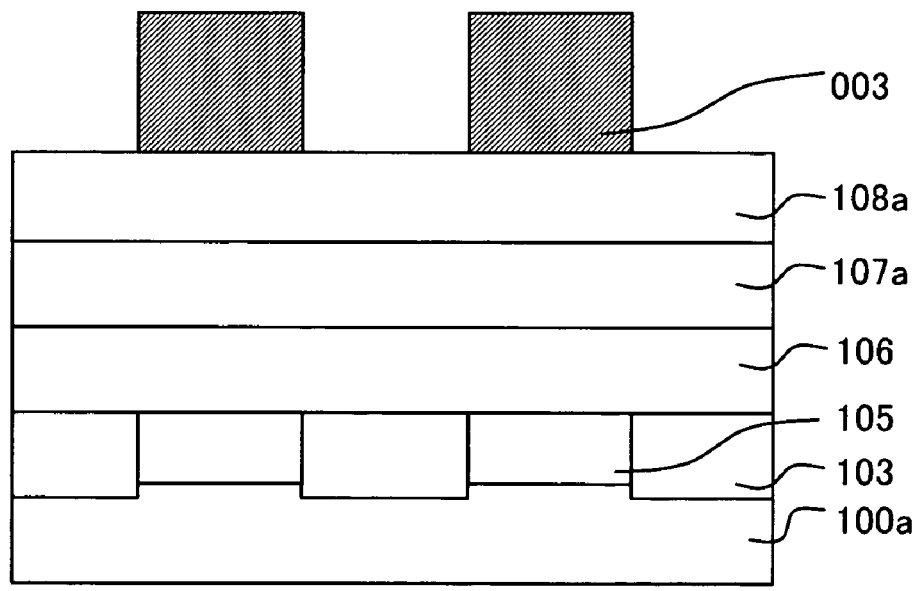
Figure 12A:
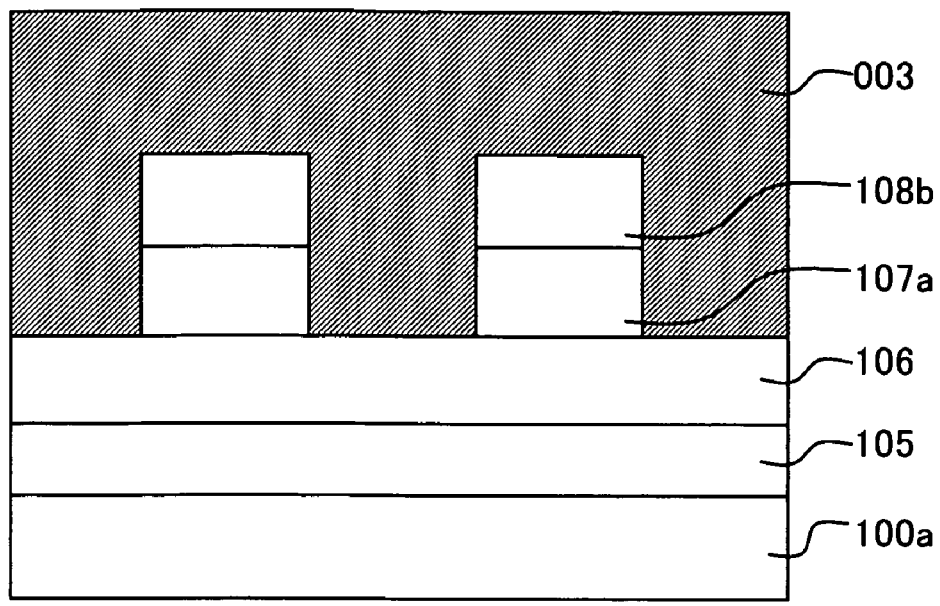
FIG. 12A and FIG. 12B are cross sectional views at a still further step of fabricating the memory cells or the memory array in the method of manufacturing a semiconductor memory device showing the first embodiment of the present invention.
Figure 12B:
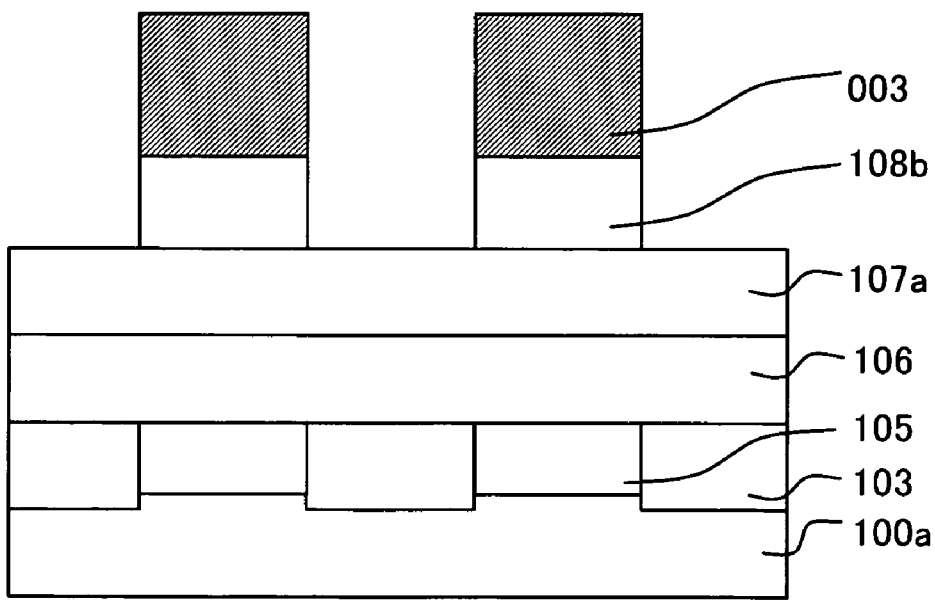

Then, using the masks of the stripe pattern of silicon nitride layer 108a, a portion of the third semiconductor layer 107 of an epitaxial form is selectively etched to form stripes of groove (turned to a third semiconductor layers 107a after the etching process as shown in FIG. 10). The etching is carried out to a depth greater than the thickness of the third semiconductor layer 107. Using a pattern of third resist mask 003 (FIG. 11) determined by a known photolithography process, the silicon nitride layer 108a is selectively etched by a reactive ion etching process (See FIG. 12). As the result, islands of the silicon nitride layer 108a remain above at each of the intersection of the word line and the source line.

Figure 13A:
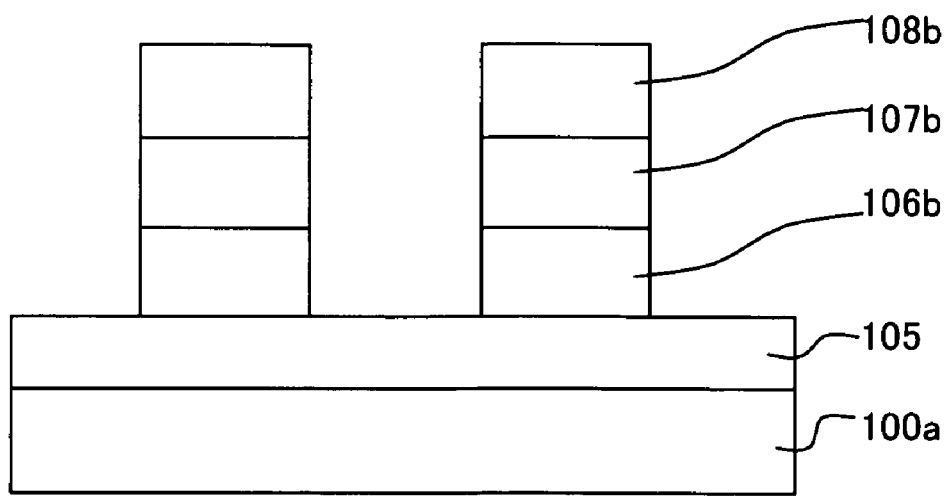
FIG. 13A and FIG. 13B are cross sectional views at a still further step of fabricating the memory cells or the memory array in the method of manufacturing a semiconductor memory device showing the first embodiment of the present invention.
Figure 13B:
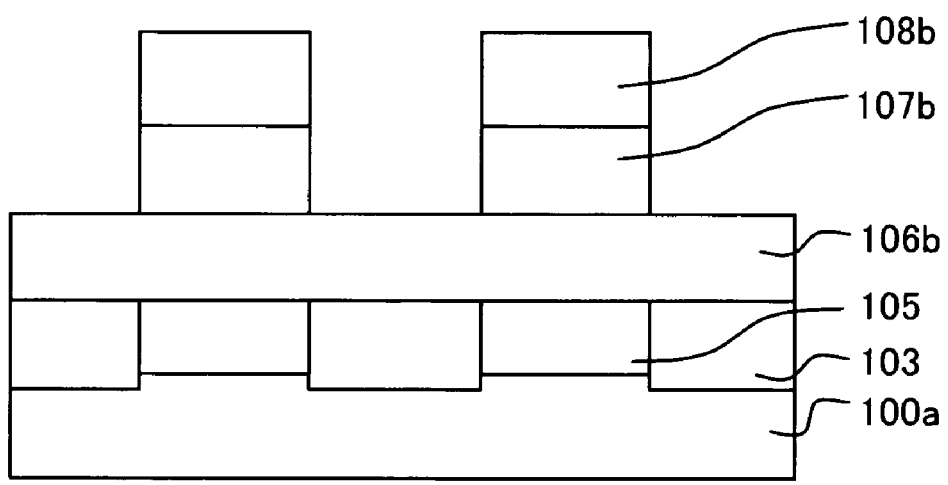

Using the silicon nitride layers 108b of an island shape patterned as masks with the second and third resist masks, the second semiconductor layer 106 of an epitaxial form and a portion of the third semiconductor layer 107a developed by the first patterning process are selectively etched to pattern a second semiconductor layer 106b and a third semiconductor layer 107b (See FIG. 13). Similarly, the etching is carried out to a depth greater than the thickness of the third semiconductor layer 107. As the result, the second semiconductor layer 106b is patterned to stripe shapes which serve as the word lines. The third semiconductor layer 107b on the second semiconductor layer 106b is shaped of an island form, similar to that of the silicon nitride layer 108b, which acts as the collector of the bipolar transistor.

Figure 14A:
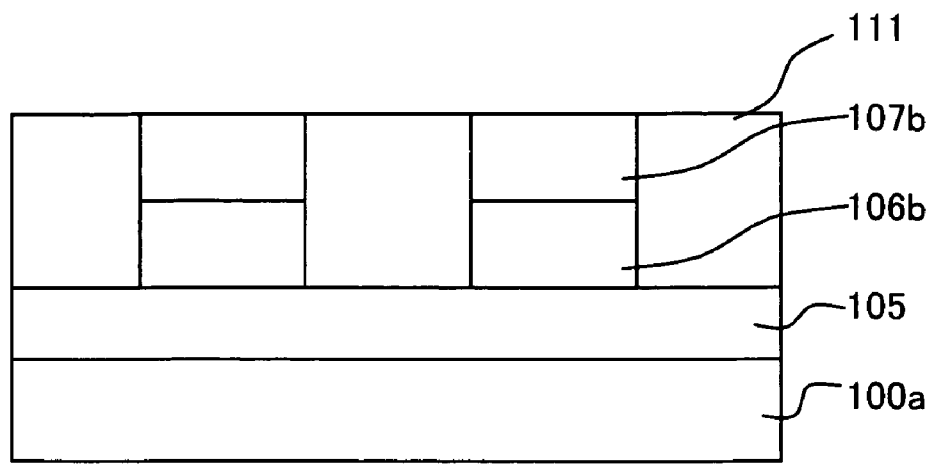
FIG. 14A and FIG. 14B are cross sectional views at a still further step of fabricating the memory cells or the memory array in the method of manufacturing a semiconductor memory device showing the first embodiment of the present invention.
Figure 14B:
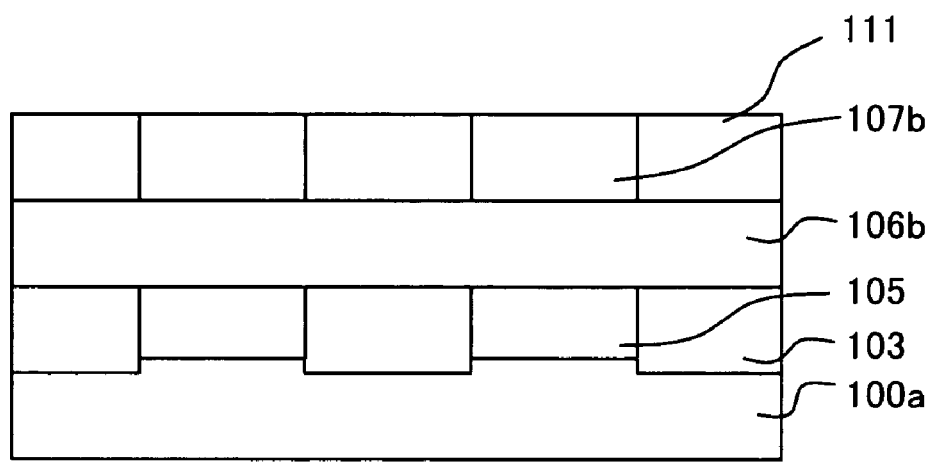
Figure 15A:
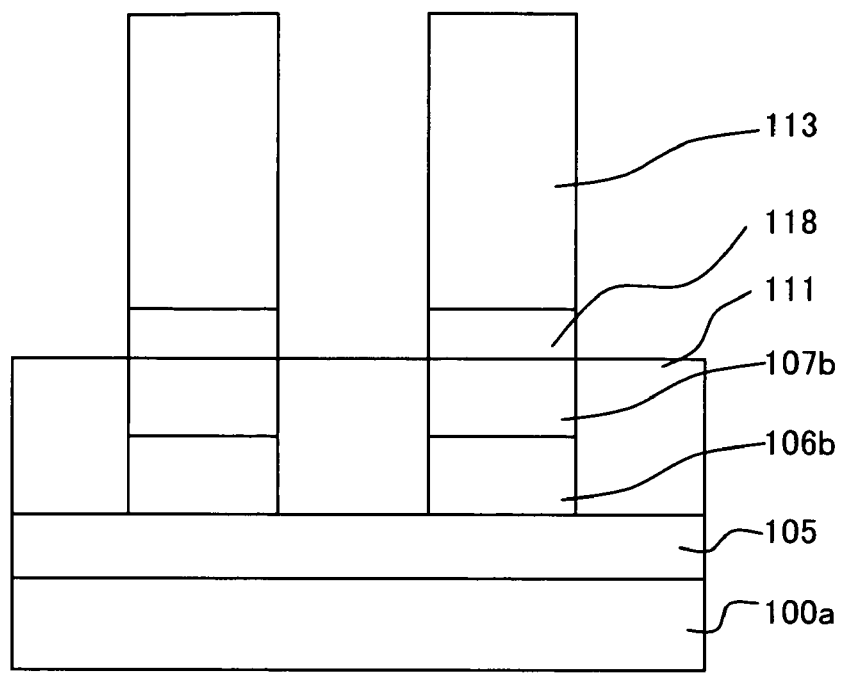
FIG. 15A and FIG. 15B are cross sectional views at a still further step of fabricating the memory cells or the memory array in the method of manufacturing a semiconductor memory device showing the first embodiment of the present invention.
Figure 15B:
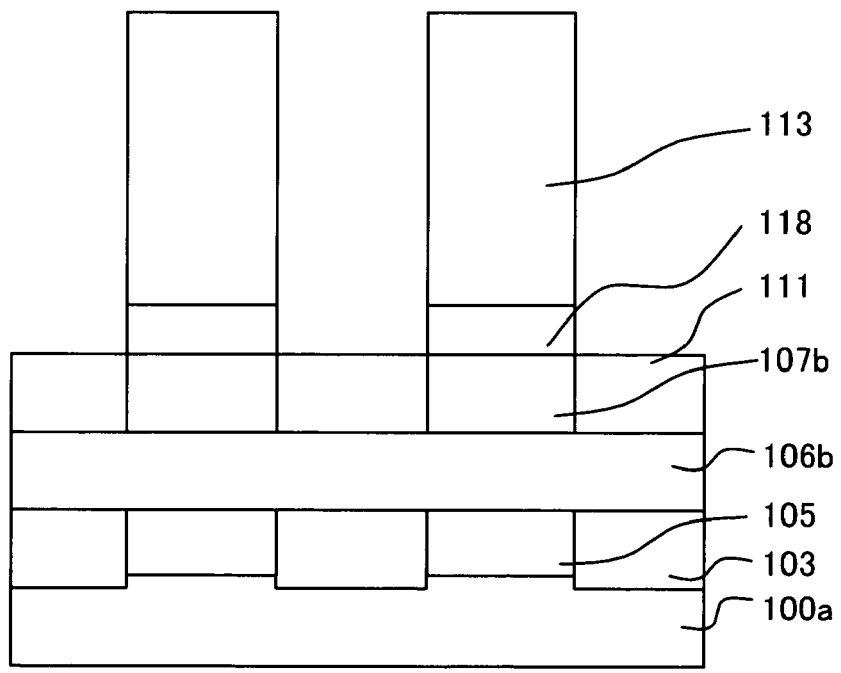
Figure 16A:
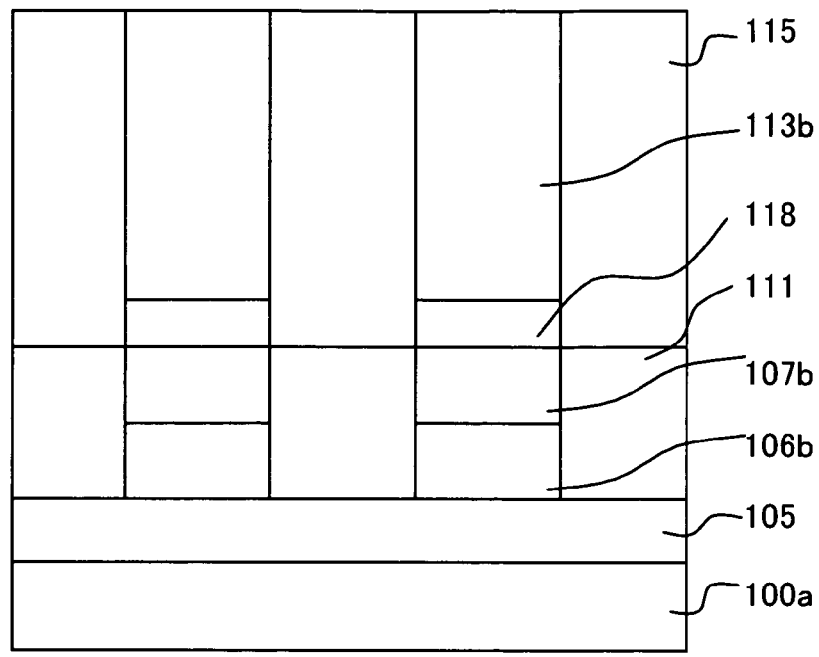
FIG. 16A and FIG. 16B are cross sectional views at a still further step of fabricating the memory cells or the memory array in the method of manufacturing a semiconductor memory device showing the first embodiment of the present invention.
Figure 16B:
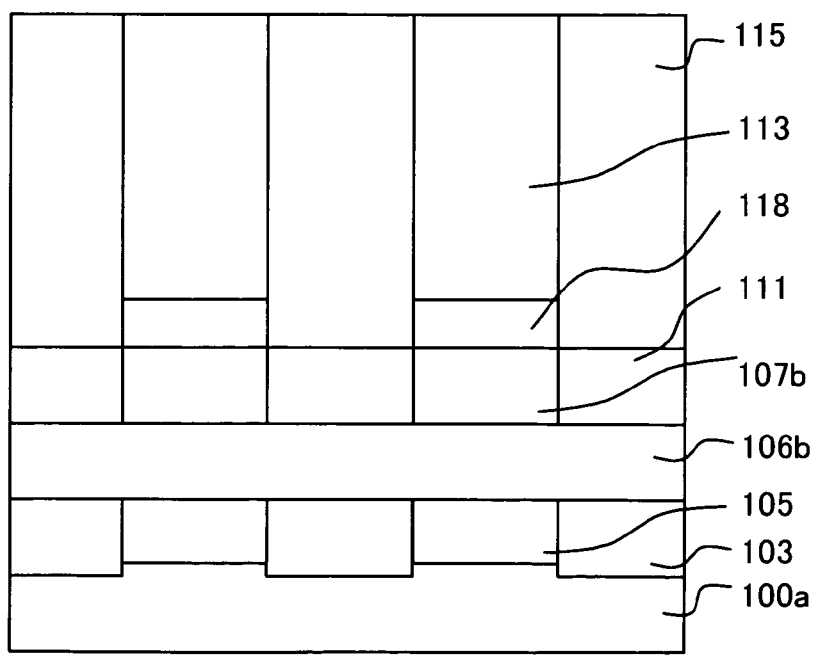

This is followed by selectively removing the silicon nitride layers 108b and filling the groove (about the second semiconductor layer 106b and the third semiconductor layer 107b) with an insulating layer 111 (See FIG. 14). Alternatively, when the insulating layer 111 has been developed in the groove, the silicon nitride layer 108b may selectively be removed.

Then, the second electrode 118 is developed by depositing a metal such as Pt and the variable resistor body 113 is deposited on the second electrode 118 as made of a thin film material such as PCMO. Further, using a fourth resist mask (not shown) patterned by a known photolithography process, the second electrode 118 and the variable resistor body 113 are subjected to a reactive ion etching process to pattern their island forms on the third semiconductor layer 107b (See FIG. 15). Next, the space between the variable resistor elements is filled with a silicon oxide layer 115 (See FIG. 16).

Figure 17A:
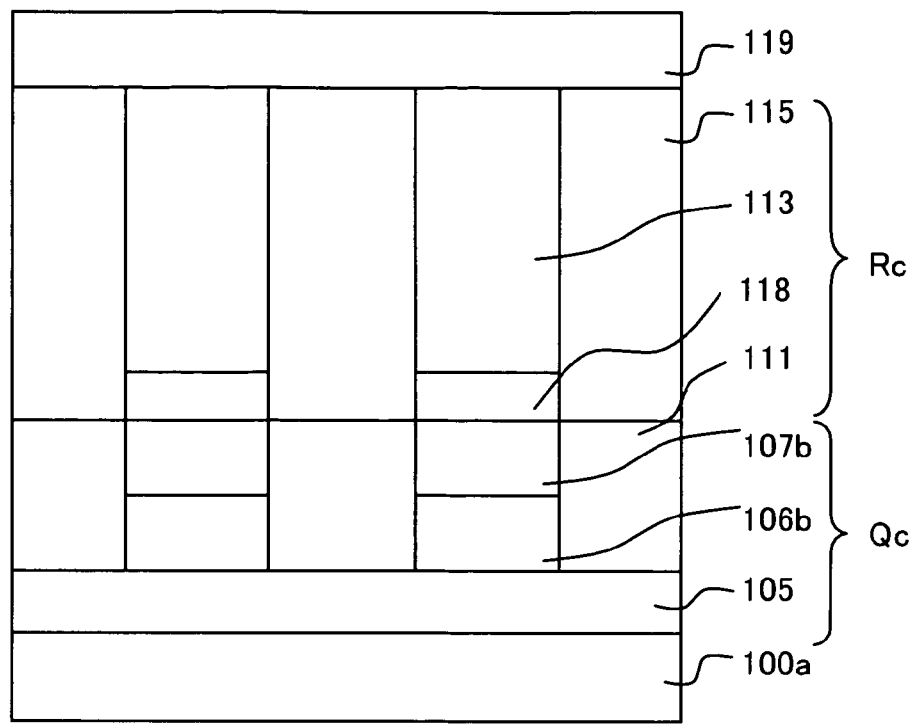
FIG. 17A and FIG. 17B are cross sectional views at a still further step of fabricating the memory cells or the memory array in the method of manufacturing a semiconductor memory device showing the first embodiment of the present invention.
Figure 17B:
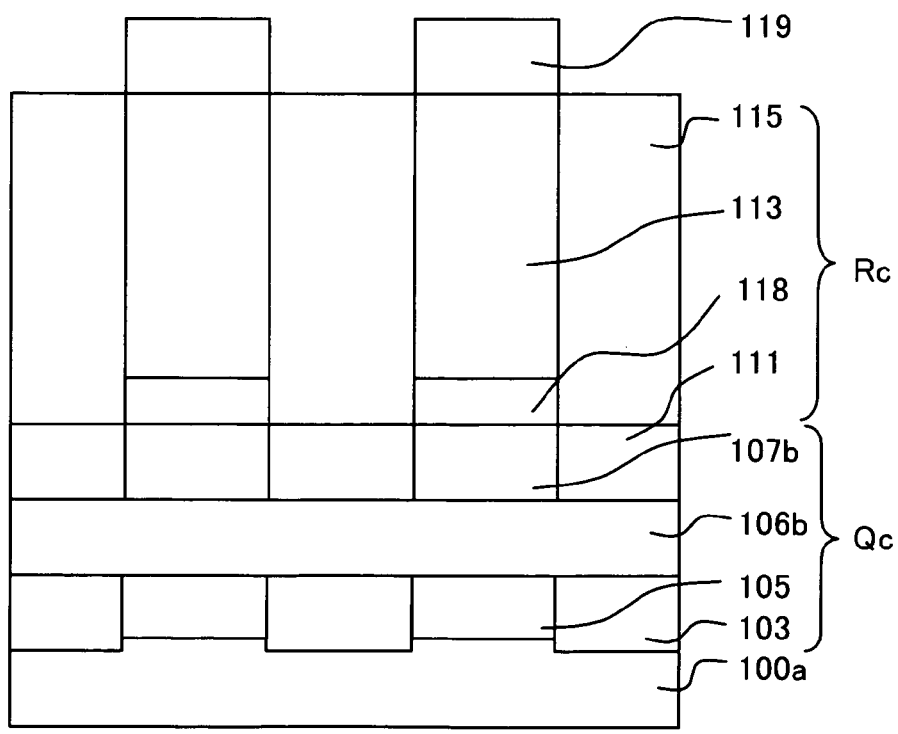
Figure 18A:
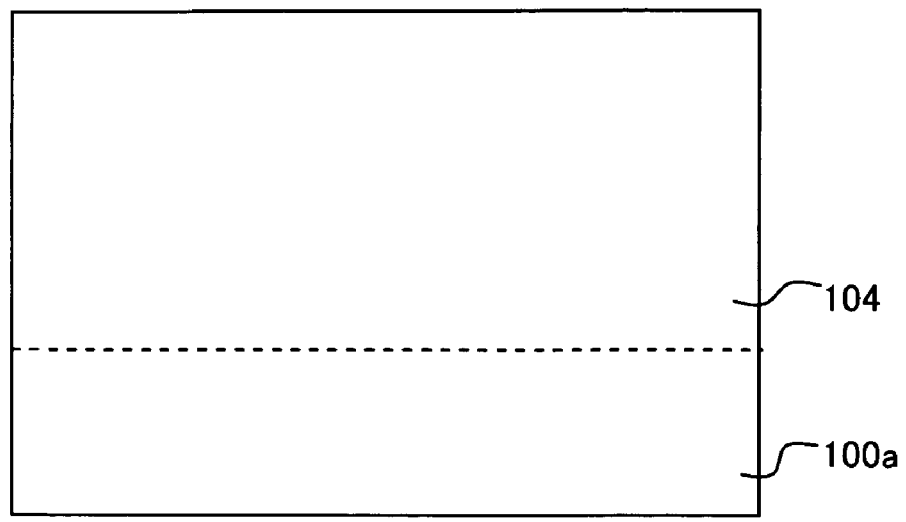
FIG. 18A and FIG. 18B are cross sectional views at a step of fabricating the memory cells or the memory array in another method of manufacturing a semiconductor memory device showing a second embodiment of the present invention.
Figure 18B:
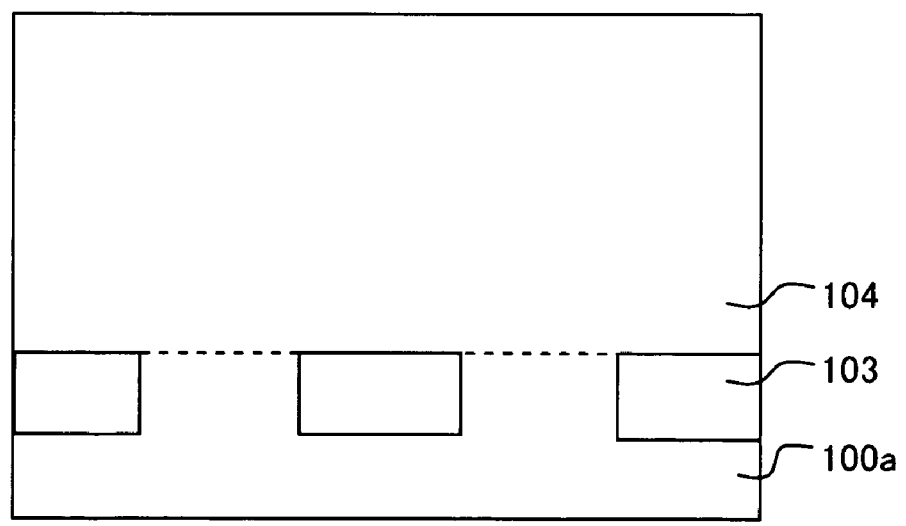
Figure 19A:
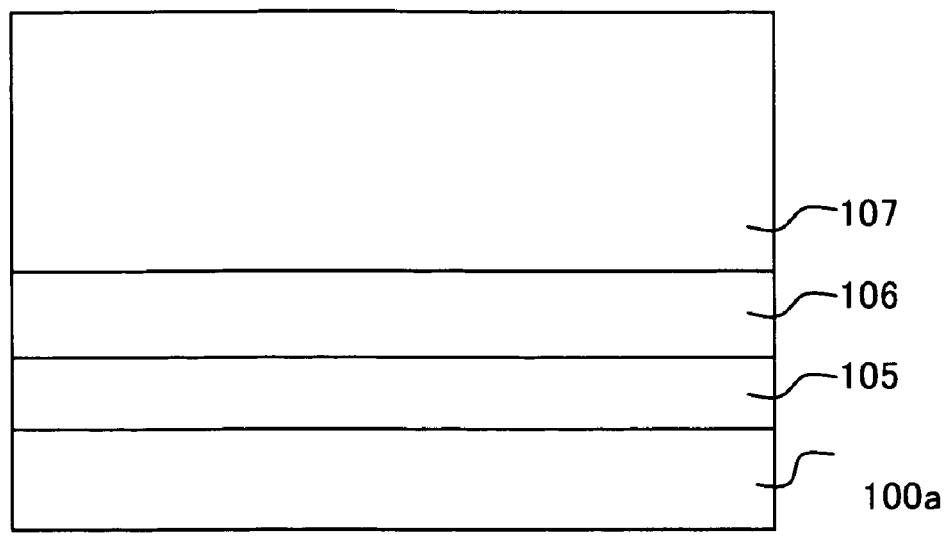
FIG. 19A and FIG. 19B are cross sectional views at another step of fabricating the memory cells or the memory array in the method of manufacturing a semiconductor memory device showing the second embodiment of the present invention.
Figure 19B:
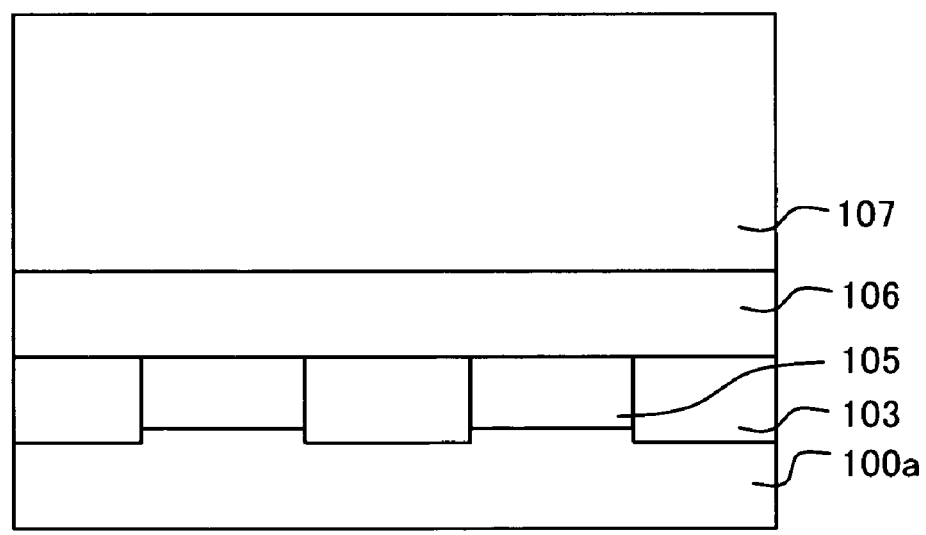
Figure 20A:
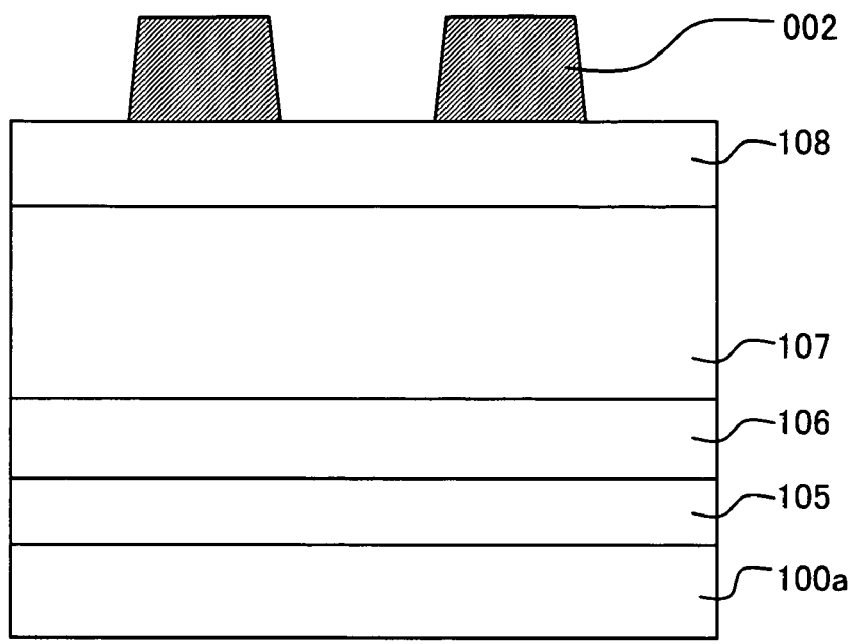
FIG. 20A and FIG. 20B are cross sectional views at a further step of fabricating the memory cells or the memory array in the method of manufacturing a semiconductor memory device showing the second embodiment of the present invention.
Figure 20B:
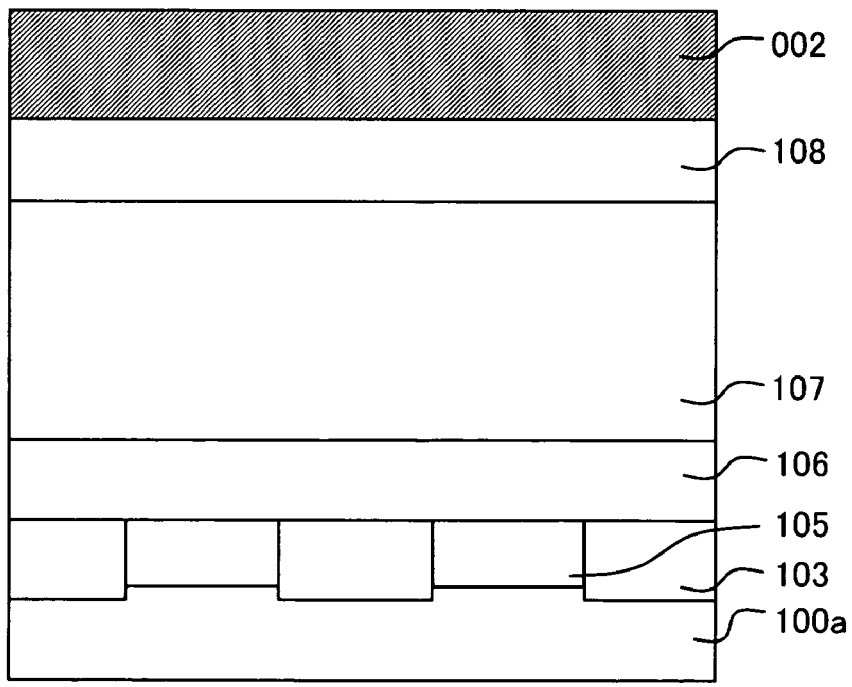

Using a known technique, the first electrode 119 is developed on the variable resistor bodies 113 by depositing a metal such as Pt. The first electrode 119 is etched to develop a pattern of metal wiring (acting as the bit lines as shown in FIG. 17) by a reactive ion etching process using a fifth resist mask (not shown) which has been patterned by a known photolithography process.

The bit lines may be implemented as a pattern of Al, AlCu, or Cu layer on the first electrode thus minimizing in the resistance. The second electrode 118 may also be developed by modifying a region close to the surface of the third semiconductor layer 107 to a silicide form.

Second Embodiment

Figure 3A:
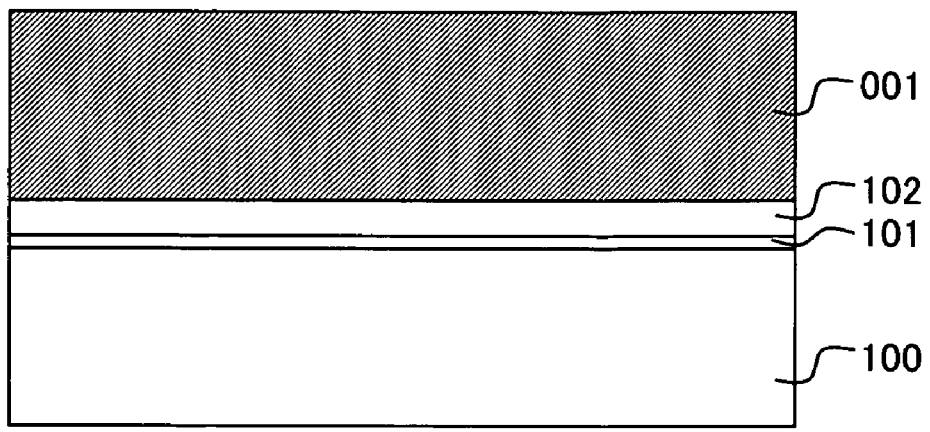
FIG. 3A and FIG. 3B are cross sectional views at a step of fabricating the memory cells or the memory array in a method of manufacturing a semiconductor memory device showing the first embodiment of the present invention.
Figure 3B:
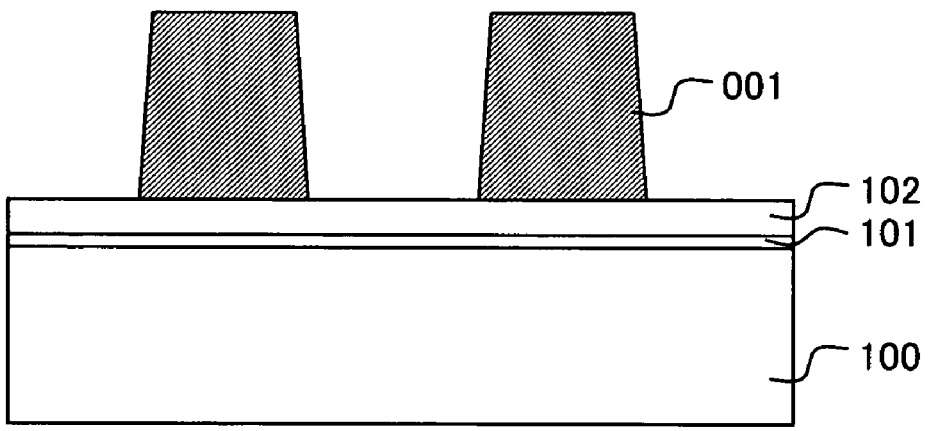
Figure 4A:
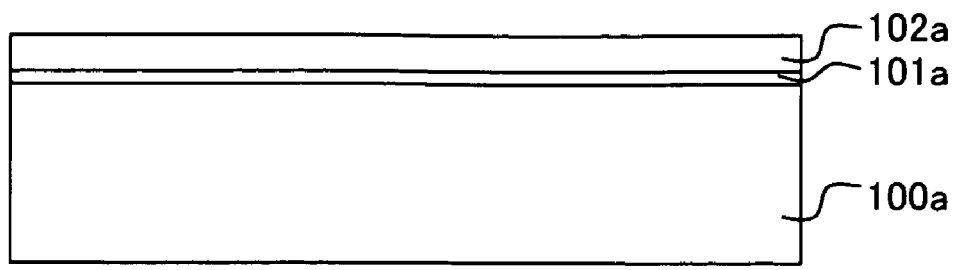
FIG. 4A and FIG. 4B are cross sectional views at another step of fabricating the memory cells or the memory array in the method of manufacturing a semiconductor memory device showing a first embodiment of the present invention.
Figure 4B:
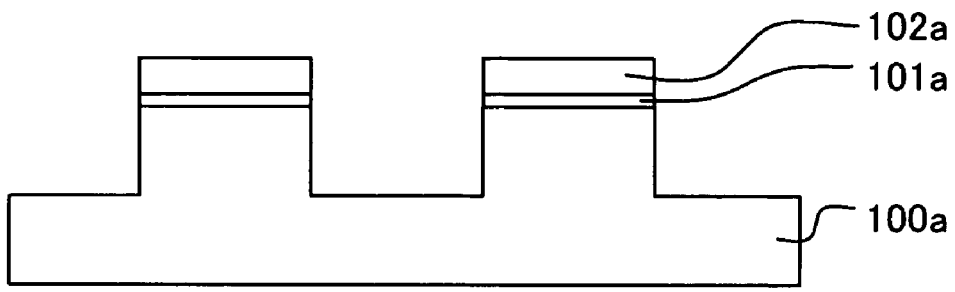
Figure 5A:
FIG. 5A and FIG. 5B are cross sectional views at a further step of fabricating the memory cells or the memory array in the method of manufacturing a semiconductor memory device showing the first embodiment of the present invention.
Figure 5B:
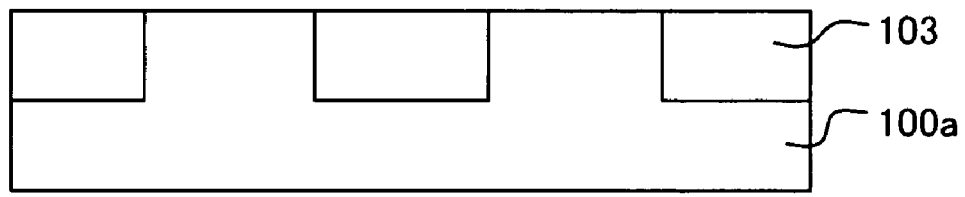
Figure 6A:
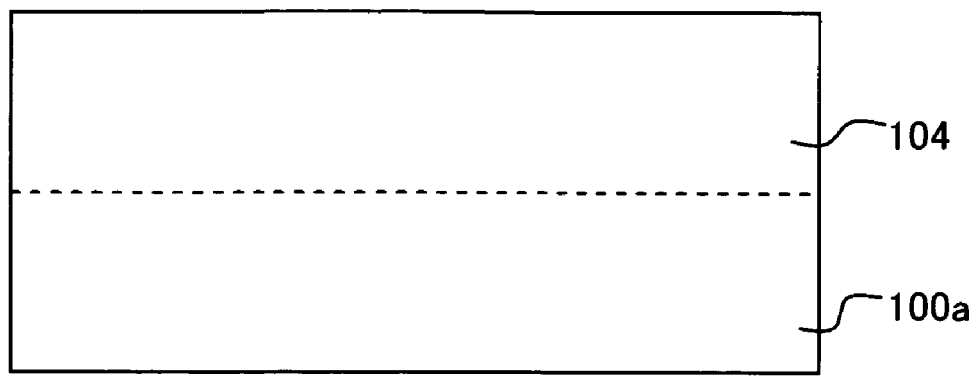
FIG. 6A and FIG. 6B are cross sectional views at a still further step of fabricating the memory cells or the memory array in the method of manufacturing a semiconductor memory device showing the first embodiment of the present invention.
Figure 6B:
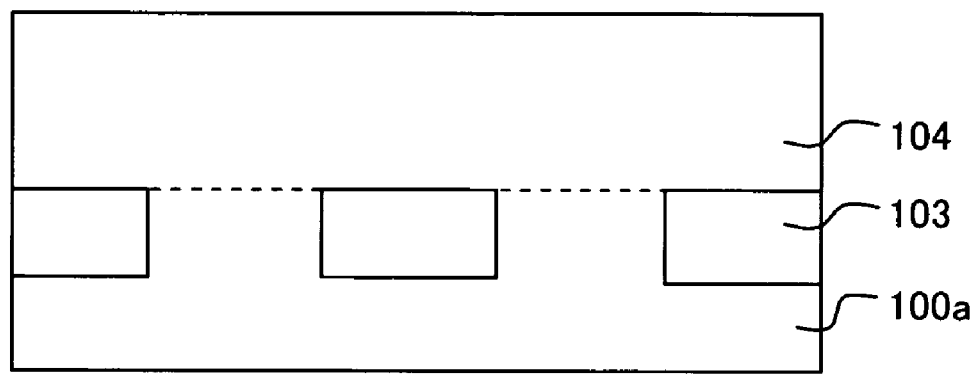
Figure 7A:
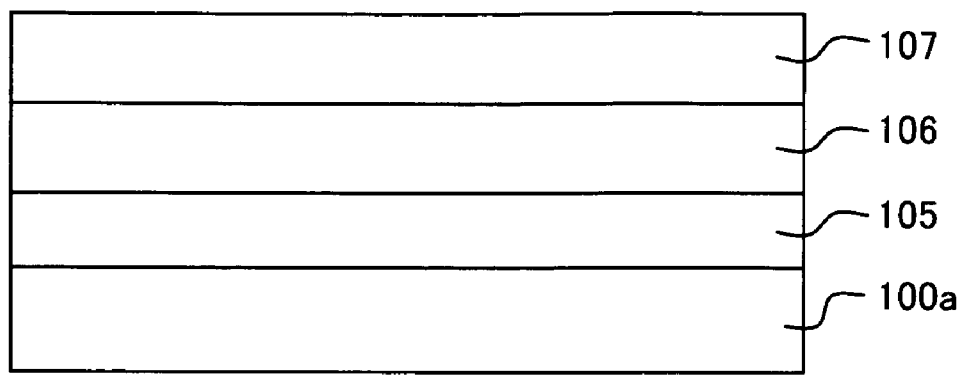
FIG. 7A and FIG. 7B are cross sectional views at a still further step of fabricating the memory cells or the memory array in the method of manufacturing a semiconductor memory device showing the first embodiment of the present invention.
Figure 7B:
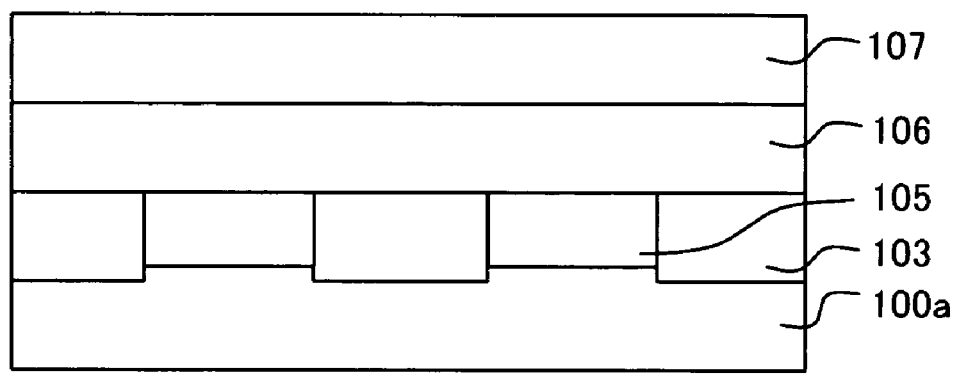
Figure 8A:
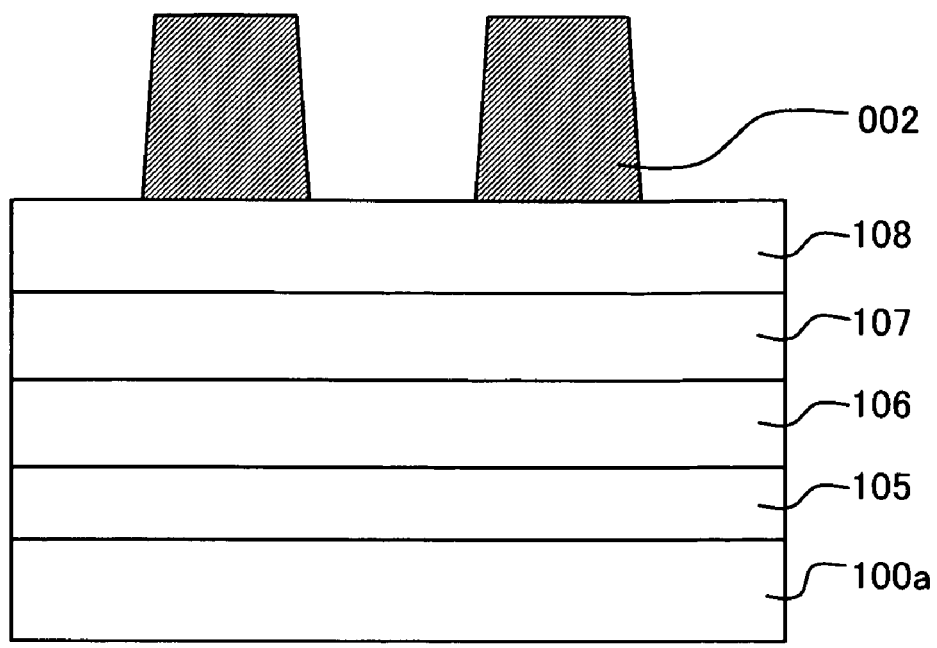
FIG. 8A and FIG. 8B are cross sectional views at a still further step of fabricating the memory cells or the memory array in the method of manufacturing a semiconductor memory device showing the first embodiment of the present invention.
Figure 8B:
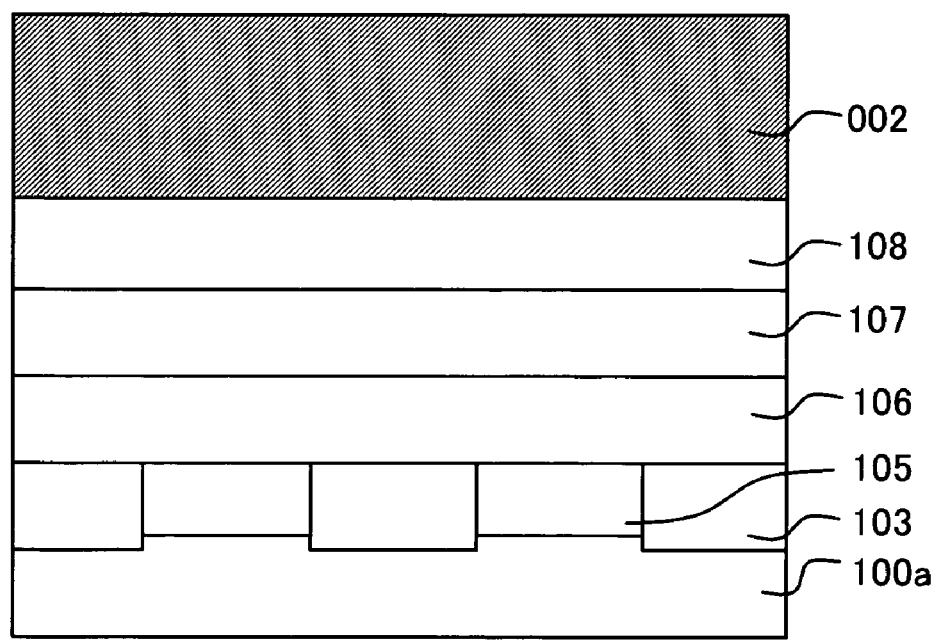

This embodiment will be described in the form of a semiconductor memory device where the second electrode and the variable resistor body are positioned by a self-alignment process in relation to the selected transistor, referring to FIGS. 18 to 29. Each drawing denoted by the letter A represents a cross sectional view taken along the line A-A of a plan view of the memory array of FIG. 2 while each drawing denoted by the letter B is a cross sectional view taken along the line B-B of the same. This embodiment is identical to the first embodiment up to the steps of filling the groove, which has been patterned using the resist mask 001, with an insulating layer or silicon oxide layer 103 (as shown in FIGS. 3 to 5).

After the silicon oxide layer 103 is developed in the groove, a p-type epitaxial silicon layer 104 is deposited to a thickness of 1 to 10 μm on the surface of the p-type silicon substrate 100a and the silicon oxide layer 103. It is desired that the p-type epitaxial silicon layer 104 is developed at its impurity volumetric density of $10^{15}$ to $10^{18}/cm^3$ (See FIG. 18).

Then, a first semiconductor layer 105 (acting as the source line and the emitter of a selected transistor) is developed as an n-type impurity layer by, e.g., ion injection between any two adjacent silicon oxide layers 103 filling the grooves of the p-type silicon substrate 100a. It is desired that the n-type first semiconductor layer 105 is developed at its impurity volumetric density of $10^{16}$ to $10^{20}/cm^3$. Then, a second semiconductor layer 106 (turned by another patterning process to the word line and the base of the selected transistor) and a third semiconductor layer 107 (turned by the another patterning process to the collector of the selected transistor) are deposited as a p-type silicon impurity layer and an n-type silicon impurity layer respectively on the first semiconductor layer 105 similarly by ion injection (See FIG. 19). It is desired that the p-type second semiconductor layer 106 and the n-type third semiconductor layer 107 are deposited at their impurity volumetric density of $10^{16}$ to $10^{19}/cm^3$ and $10^{16}$ to $10^{20}/cm^3$ respectively. So long as the first, second, and third semiconductor layers 105, 106, and 107 are optimized in the profile of impurity density corresponding to the target voltage specifications of the bipolar transistor in each memory cell, the order of their developments will be not restricted.

Since the third semiconductor layer 107 is etched back for ease of depositing the variable resistor body 113 by self-alignment which will be explained later in more detail, its final thickness is thinner than its initial thickness. For insurance, the initial thickness of the third semiconductor layer 107 is determined to be greater than a sum of the final thickness of the third semiconductor layer 107 and the final thickness of the variable resistor body 113. It is also essential that the impurity density profile of the third semiconductor layer 107 is determined corresponding to the final thickness.

Figure 21A:
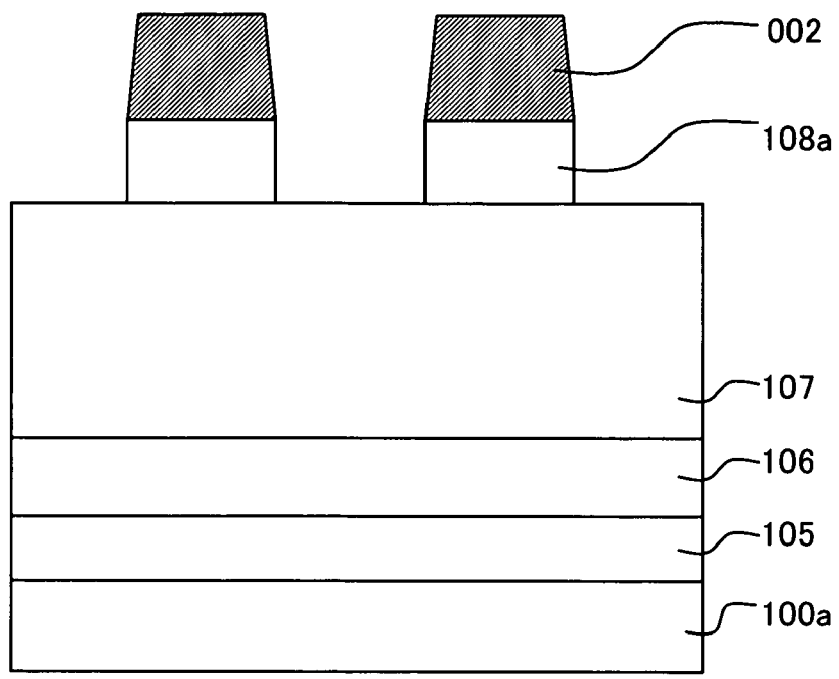
FIG. 21A and FIG. 21B are cross sectional views at a still further step of fabricating the memory cells or the memory array in the method of manufacturing a semiconductor memory device showing the second embodiment of the present invention.
Figure 21B:
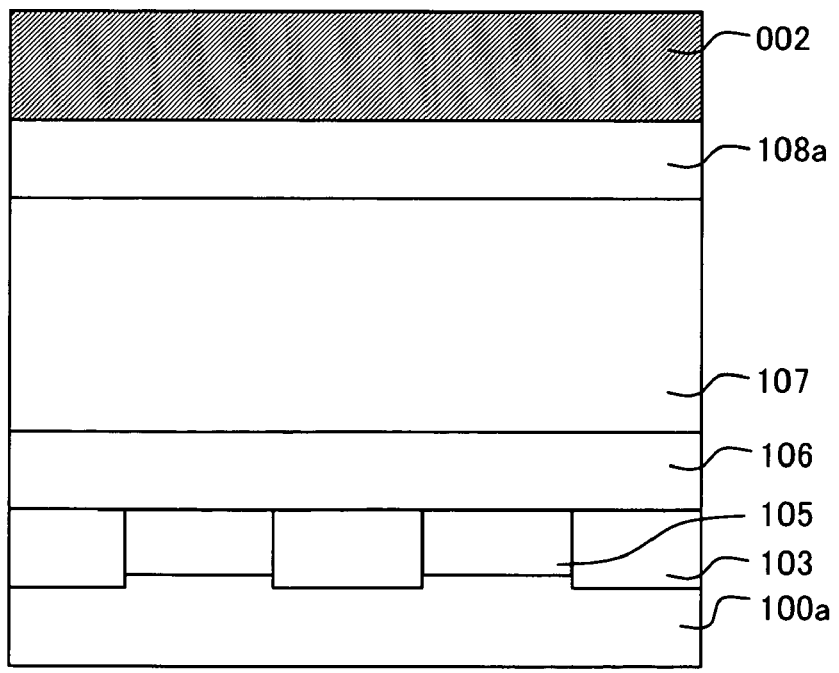

This is followed by depositing a silicon nitride layer 108 to a thickness of 100 to 1000 nm on the epitaxial silicon layer, providing a pattern of second resist masks 002 with a known photolithography process (See FIG. 20), and subjecting the silicon nitride layer 108 to a reactive ion etching process for developing a stripe pattern (See FIG. 21).

Figure 22A:
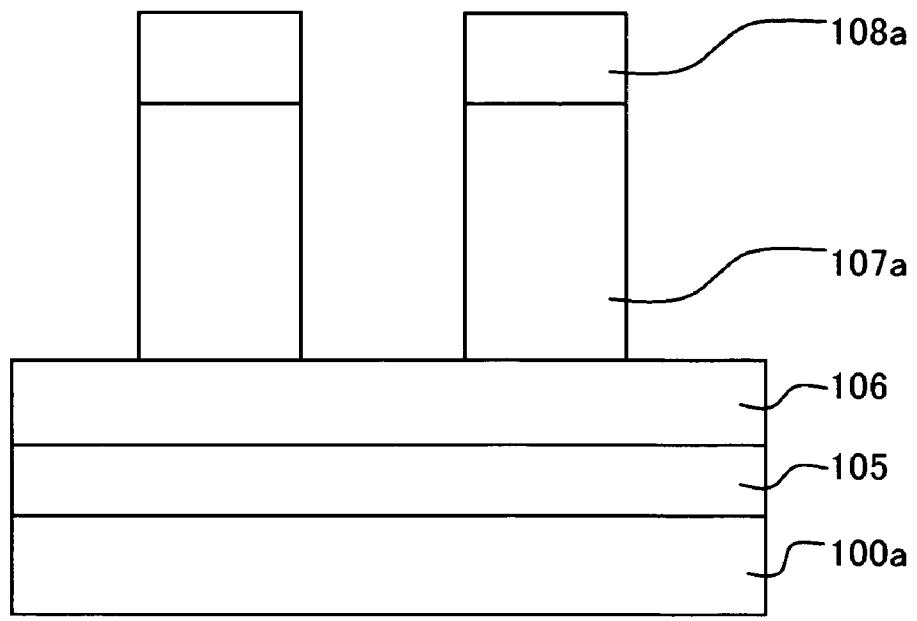
FIG. 22A and FIG. 22B are cross sectional views at a still further step of fabricating the memory cells or the memory array in the method of manufacturing a semiconductor memory device showing the second embodiment of the present invention.
Figure 22B:
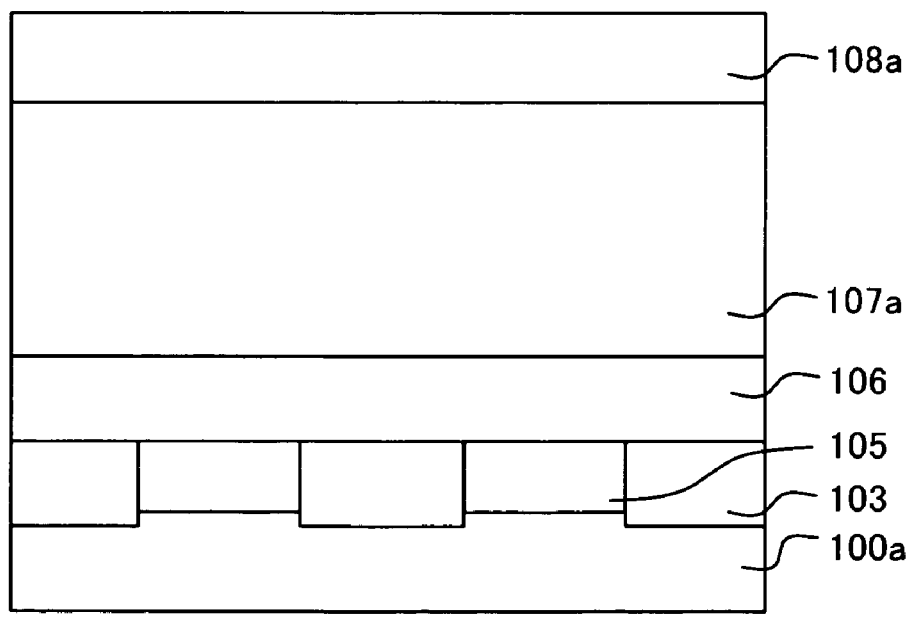
Figure 23A:
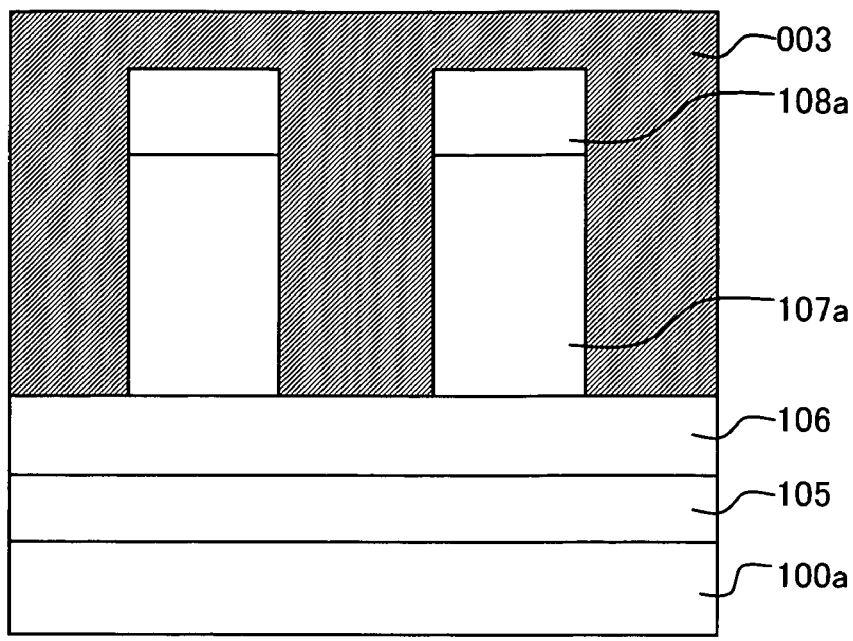
FIG. 23A and FIG. 23B are cross sectional views at a still further step of fabricating the memory cells or the memory array in the method of manufacturing a semiconductor memory device showing the second embodiment of the present invention.
Figure 23B:
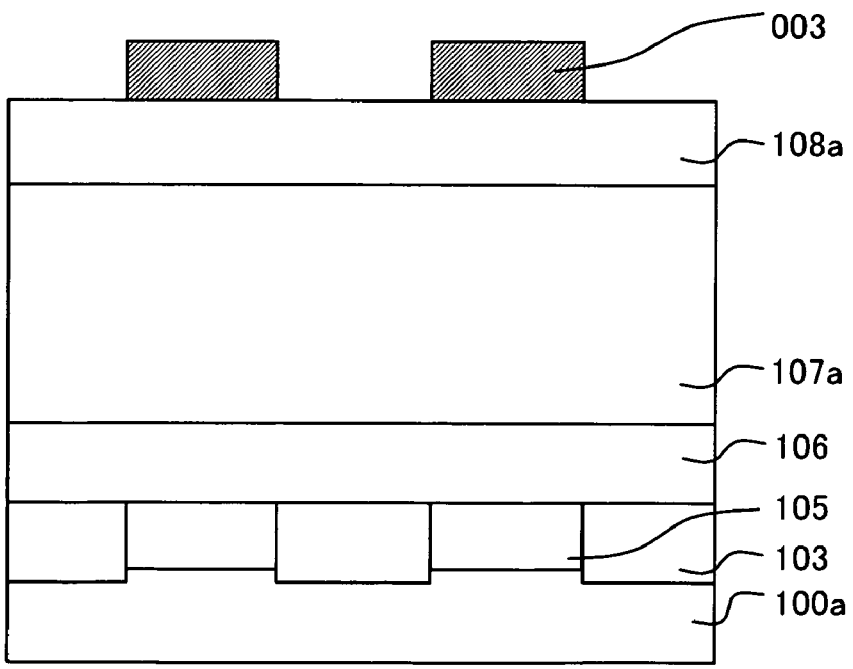
Figure 24A:
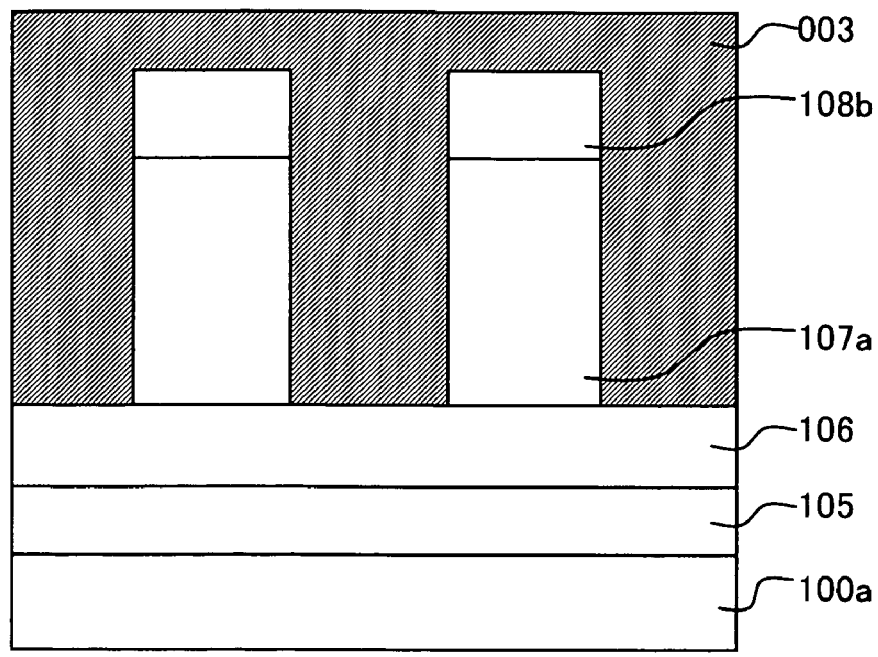
FIG. 24A and FIG. 24B are cross sectional views at a still further step of fabricating the memory cells or the memory array in the method of manufacturing a semiconductor memory device showing the second embodiment of the present invention.
Figure 24B:
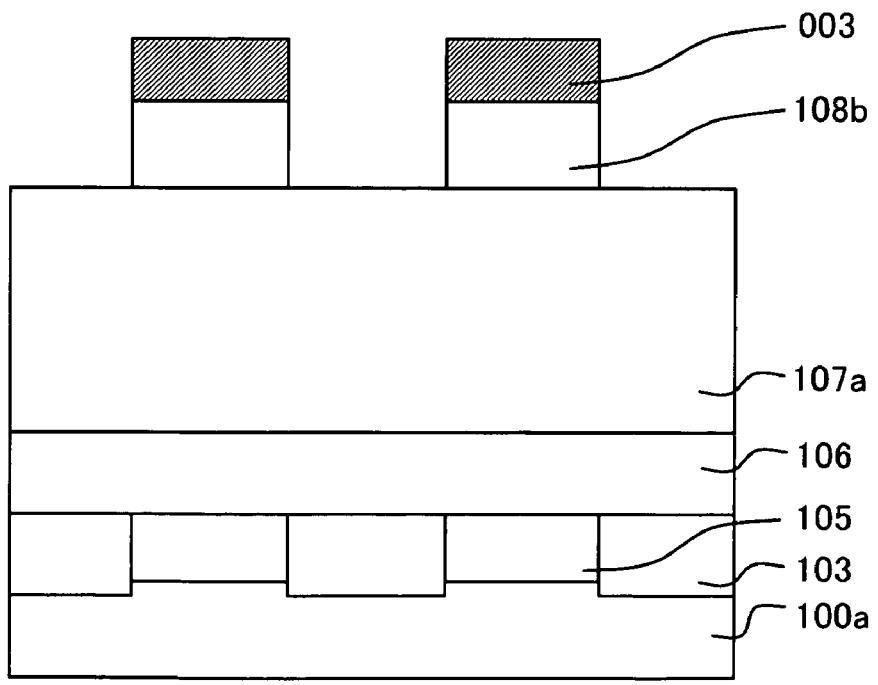

Then, using the masks of the stripe pattern of silicon nitride layer 108a, a portion of the third semiconductor layer 107 of an epitaxial form is selectively etched to form stripes of groove (turned to a third semiconductor layers 107a after the etching process as shown in FIG. 22). The etching is carried out to a depth greater than the thickness of the third semiconductor layer 107. Using a pattern of third resist mask 003 (FIG. 23) determined by a known photolithography process, the silicon nitride layer 108a is selectively etched by a reactive ion etching process (See FIG. 24). As the result, islands of the silicon nitride layer 108a remain above at each of the intersection of the word line and the source line.

Figure 25A:
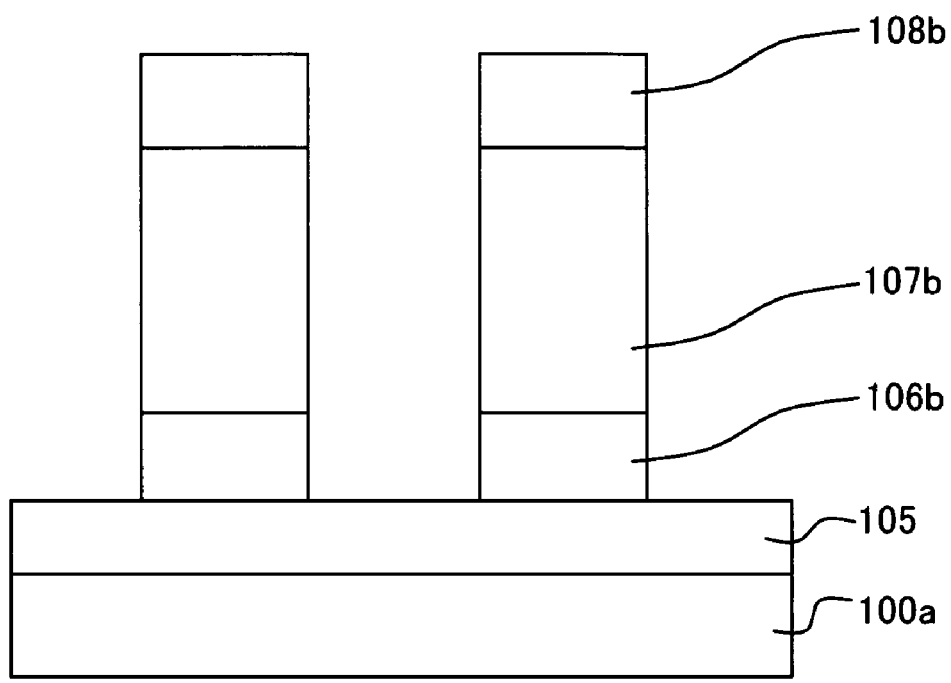
FIG. 25A and FIG. 25B are cross sectional views at a still further step of fabricating the memory cells or the memory array in the method of manufacturing a semiconductor memory device showing the second embodiment of the present invention.
Figure 25B:
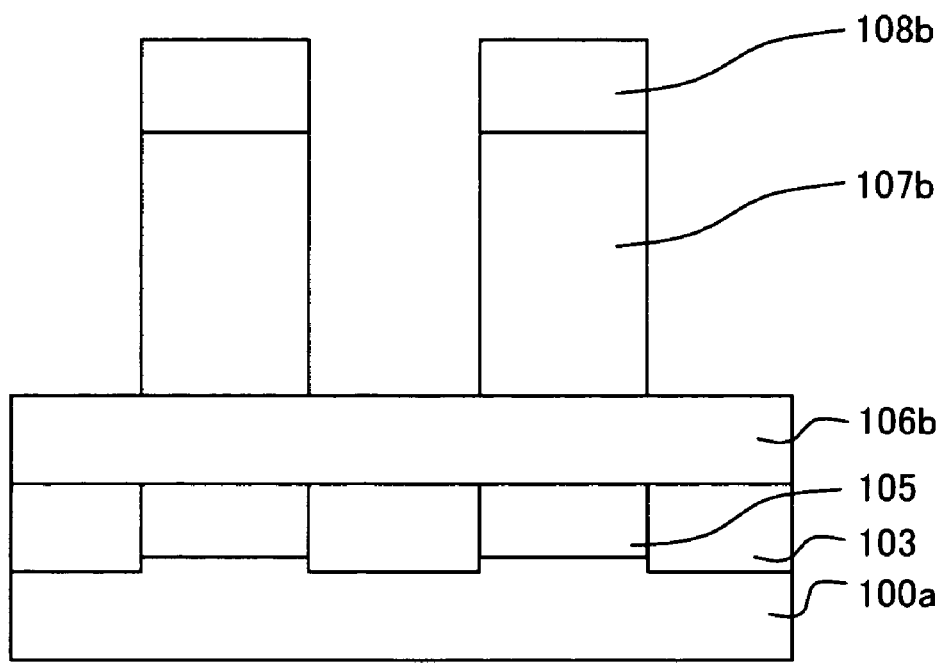

Using the silicon nitride layers 108b of an island shape patterned as masks with the second and third resist masks, the second semiconductor layer 106 of an epitaxial form and a portion of the third semiconductor layer 107a developed by the first patterning process are selectively etched to pattern a second semiconductor layer 106b and a third semiconductor layer 107b (See FIG. 25). Similarly, the etching is carried out to a depth greater than the thickness of the third semiconductor layer 107. As the result, the second semiconductor layer 106b is patterned to stripe shapes which serve as the word lines. The third semiconductor layer 107b on the second semiconductor layer 106b is shaped of an island form, similar to that of the silicon nitride layer 108b, which acts as the collector of the bipolar transistor.

Figure 26A:
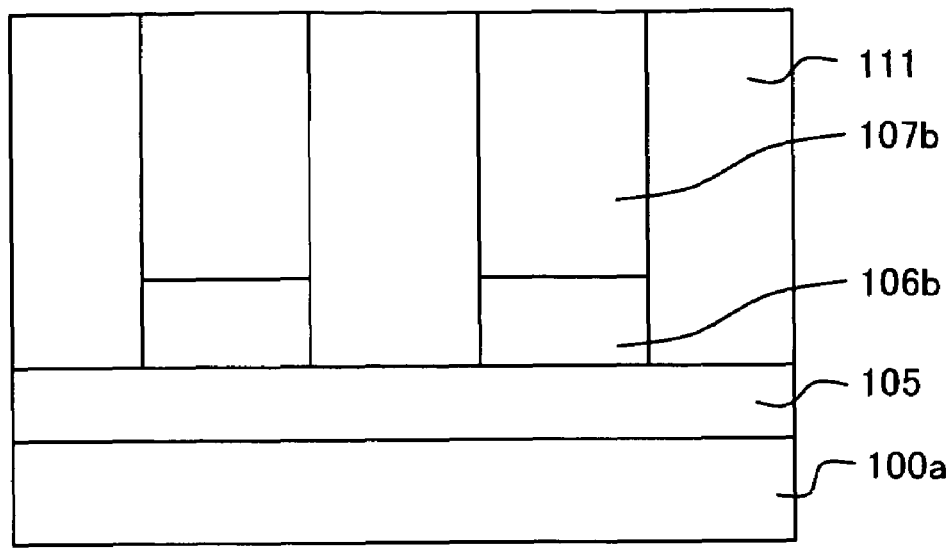
FIG. 26A and FIG. 26B are cross sectional views at a still further step of fabricating the memory cells or the memory array in the method of manufacturing a semiconductor memory device showing the second embodiment of the present invention.
Figure 26B:
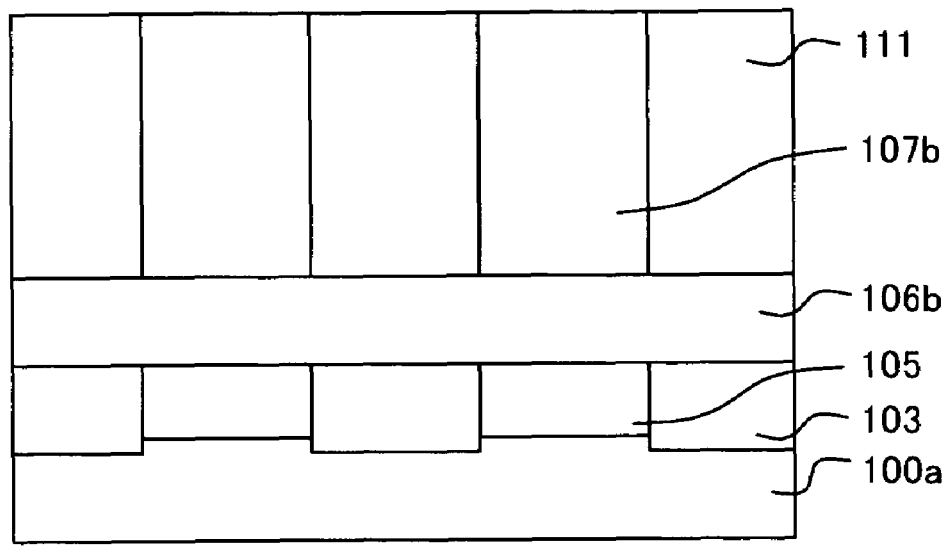

This is followed by selectively removing the silicon nitride layers 108b and filling the groove (about the second semiconductor layer 106b and the third semiconductor layer 107b) with an insulating layer 111 (See FIG. 26). Alternatively, when the insulating layer 111 has been developed in the groove, the silicon nitride layer 108b may selectively be removed.

Figure 27A:
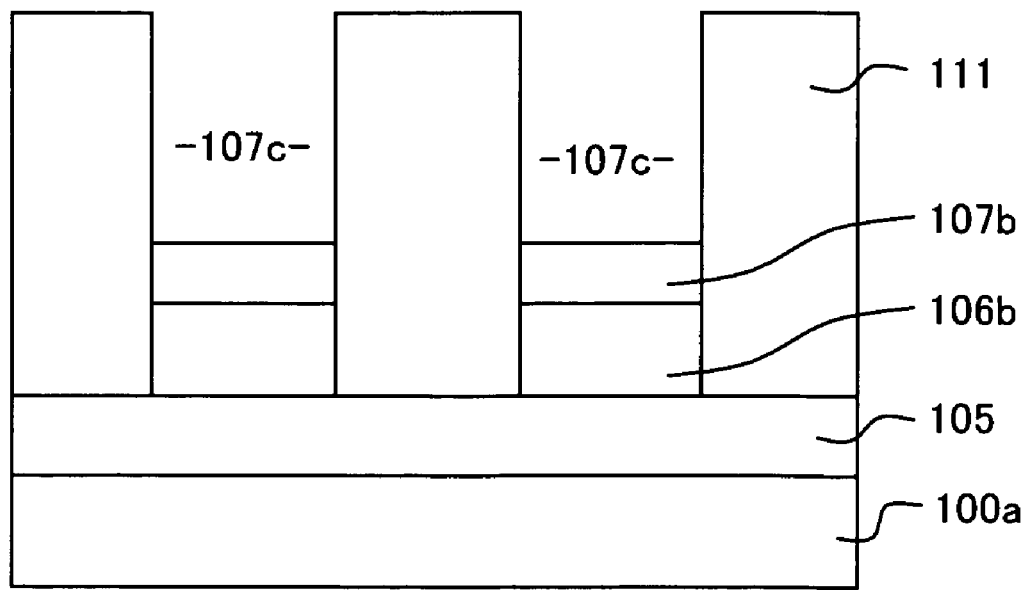
FIG. 27A and FIG. 27B are cross sectional views at a still further step of fabricating the memory cells or the memory array in the method of manufacturing a semiconductor memory device showing the second embodiment of the present invention.
Figure 27B:
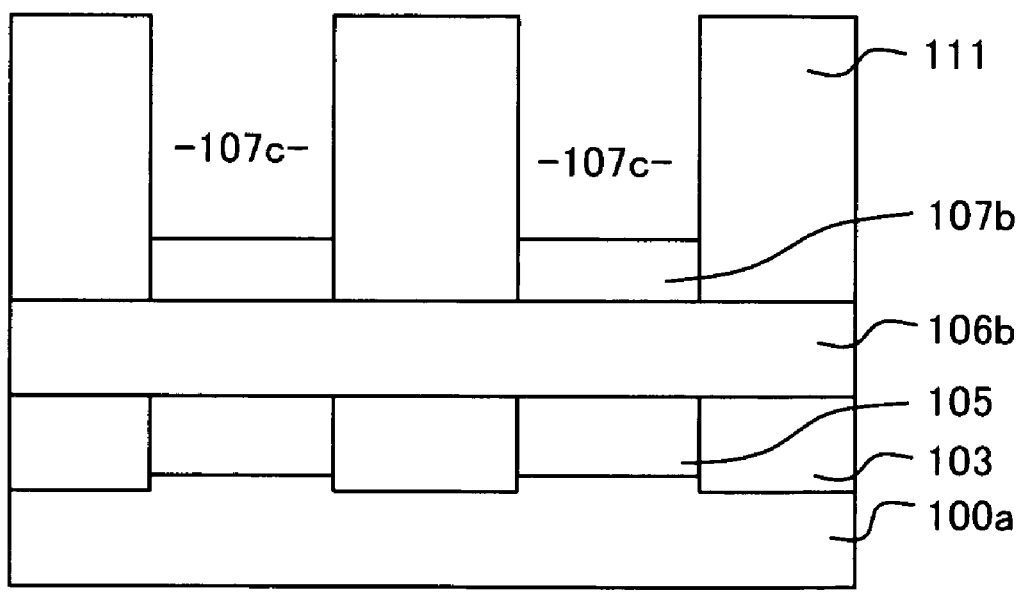
Figure 28A:
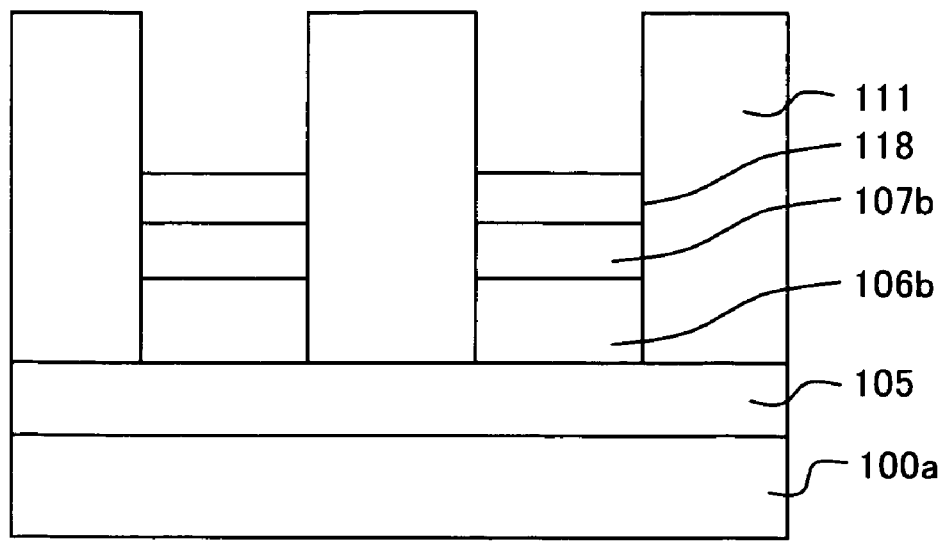
FIG. 28A and FIG. 28B are cross sectional views at a still further step of fabricating the memory cells or the memory array in the method of manufacturing a semiconductor memory device showing the second embodiment of the present invention.
Figure 28B:
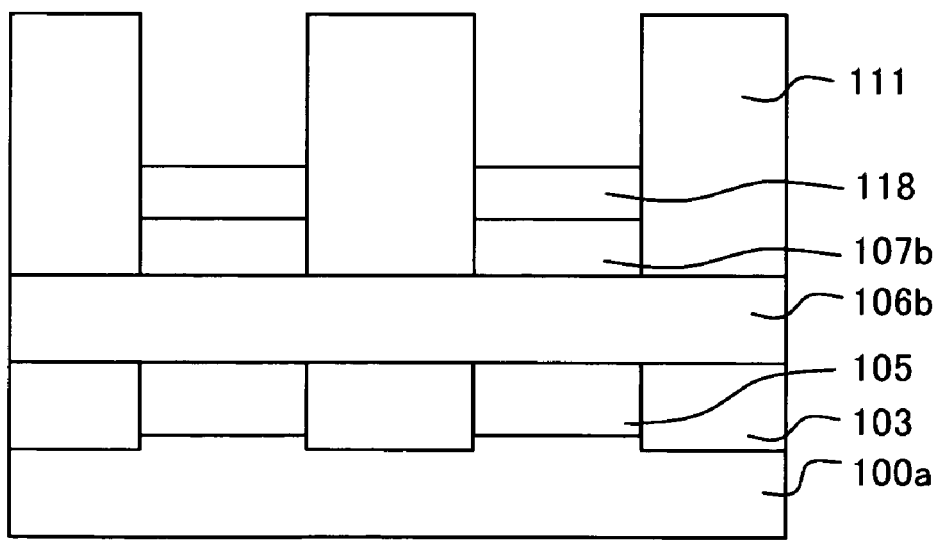

Then, the third semiconductor layer 107b after the patterning process is selectively etched back to develop holes 107c (spaces) between the insulating layers 111 which remain not etched (See FIG. 27). The second electrode 118 is developed by depositing a metal such as Pt in the holes 107c between the insulating layers 111 and then selectively etched back. Finally, the second electrode 118 is positioned and modified to a desired pattern on the third semiconductor layer 107b in the holes 107c by a self-alignment process (See FIG. 28).

Figure 29A:
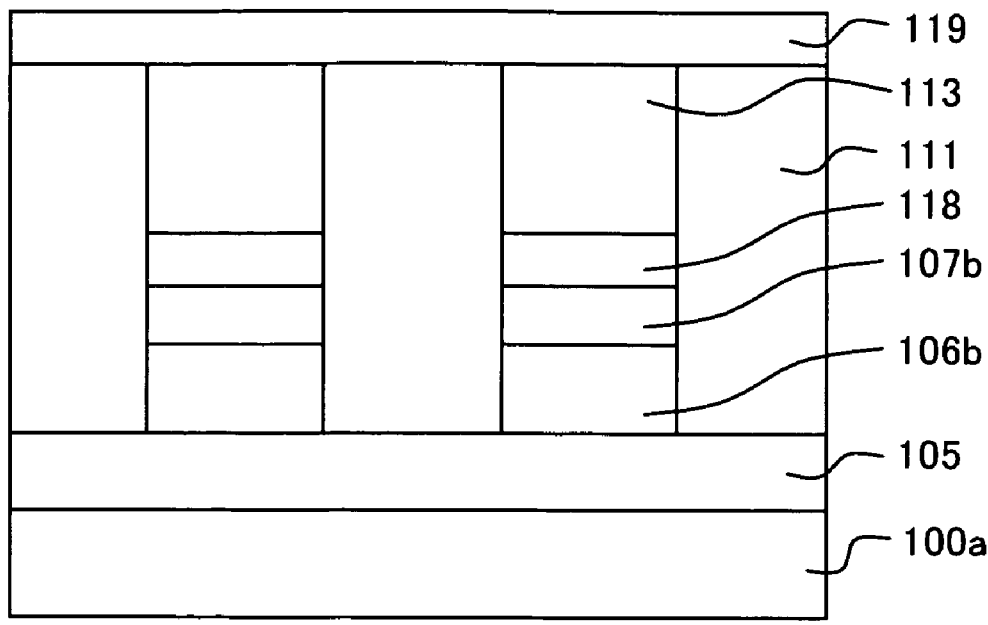
FIG. 29A and FIG. 29B are cross sectional views at a still further step of fabricating the memory cells or the memory array in the method of manufacturing a semiconductor memory device showing the second embodiment of the present invention.
Figure 29B:
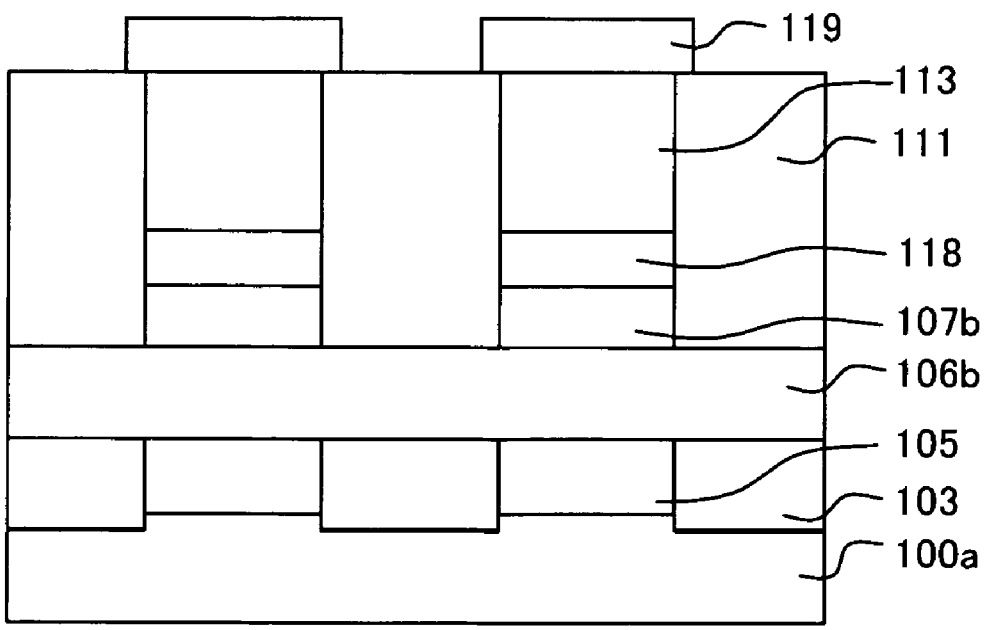

This is followed by depositing a variable resistor body 113 of a PCMO material with the use of a CMP (chemical mechanical polishing) process for having a planer surface and depositing a first electrode 119. Using a fourth resist mask (not shown) patterned by a known photolithography process, the first electrode 119 is etched by a reactive ion etching process to develop a pattern of metal wiring (acting as the bit lines as shown in FIG. 29). The bit lines may be implemented as a pattern of Al, AlCu, or Cu layer deposited on the first electrode 119 thus minimizing in the resistance. The second electrode 118 may also be developed by modifying a region close to the surface of the third semiconductor layer 107 to a silicide form.

Third Embodiment

This embodiment will be described in the form of a semiconductor memory device where a portion of the second semiconductor layer is a polycrystalline silicon layer, referring to FIGS. 34 to 37. Each drawing denoted by the letter A represents a cross sectional view taken along the line A-A of a plan view of the memory array of FIG. 2 while each drawing denoted by the letter B is a cross sectional view taken along the line B-B of the same. This embodiment is identical to the first embodiment up to the steps of filling the groove, which have been patterned using the resist mask 001, with an insulating layer or silicon oxide layer 103 (as shown in FIGS. 3 to 5).

Figure 34A:
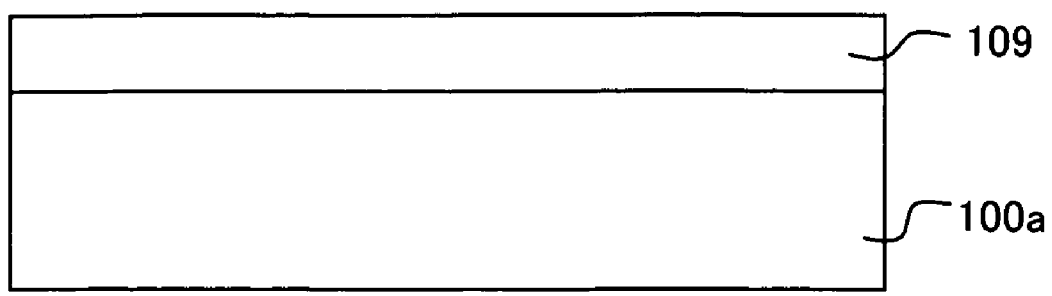
FIG. 34A and FIG. 34B are cross sectional views at a step of fabricating memory cells or a memory array in a method of manufacturing a semiconductor memory device showing a third embodiment of the present invention.
Figure 34B:
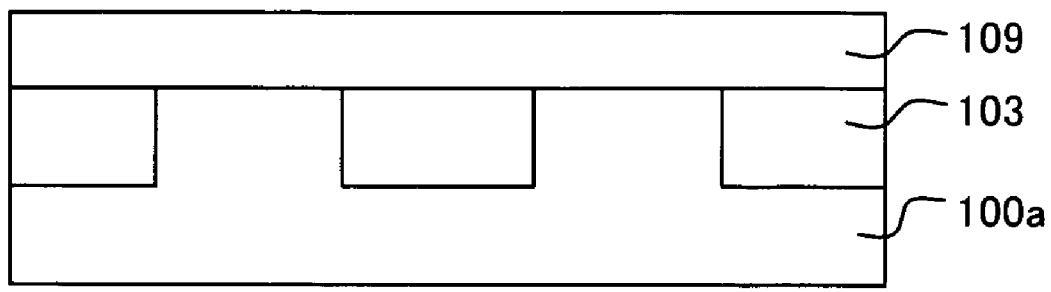
Figure 35A:
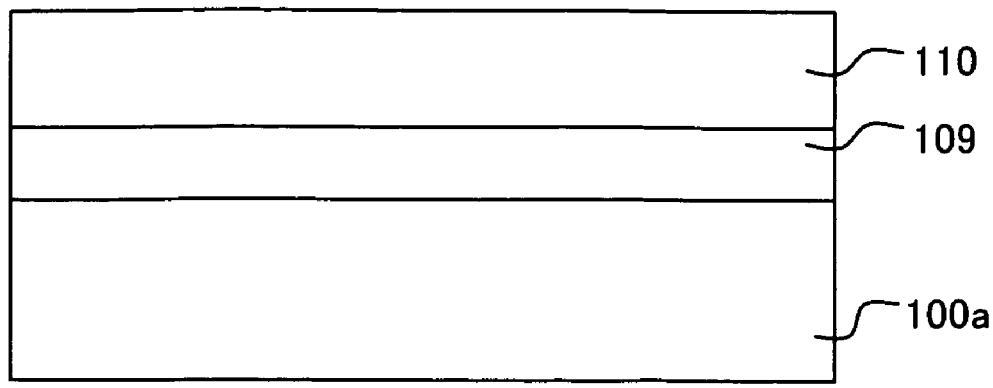
FIG. 35A and FIG. 35B are cross sectional views at another step of fabricating the memory cells or the memory array in the method of manufacturing a semiconductor memory device showing the third embodiment of the present invention.
Figure 35B:
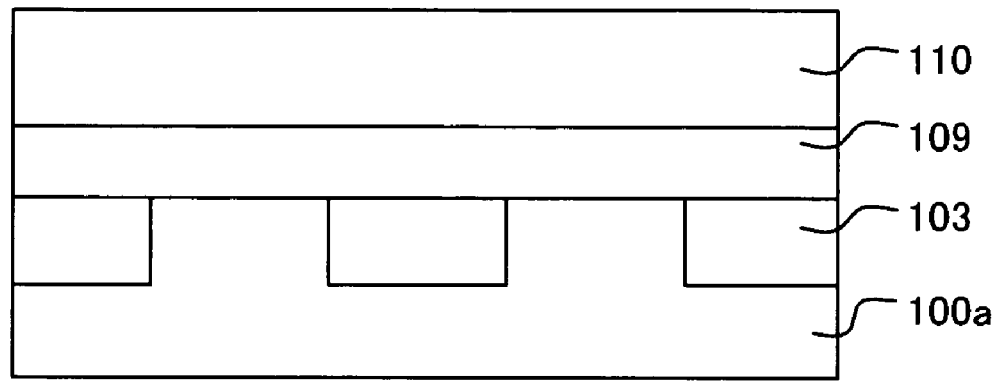
Figure 36A:
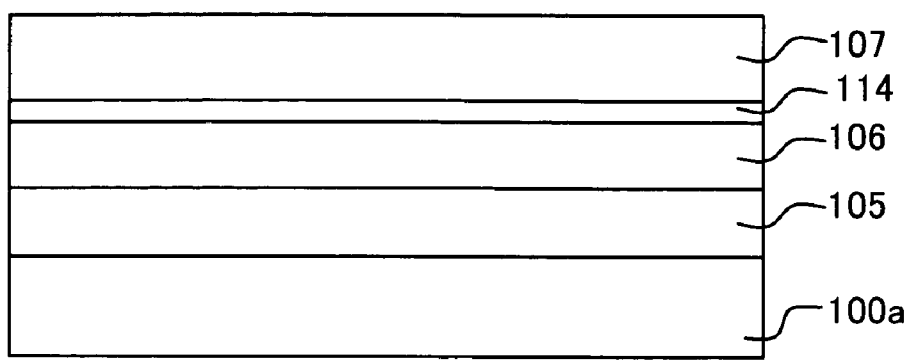
FIG. 36A and FIG. 36B are cross sectional views at a further step of fabricating the memory cells or the memory array in the method of manufacturing a semiconductor memory device showing the third embodiment of the present invention.
Figure 36B:
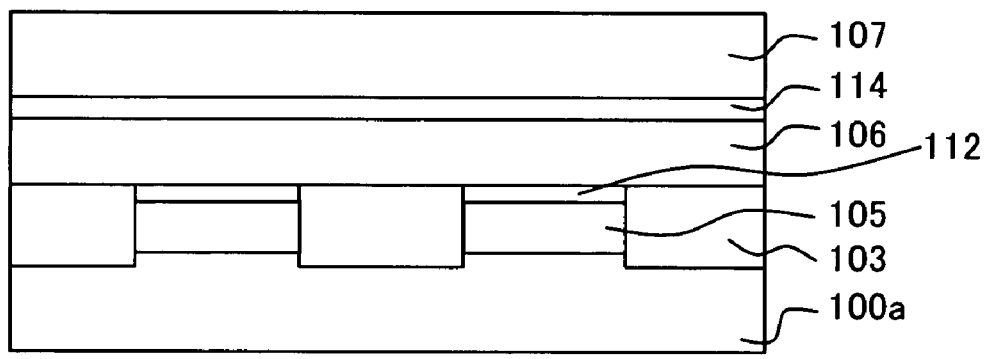

After the silicon oxide layer 103 is developed in the groove, a polycrystalline silicon layer 109 is deposited to a thickness ranging from 100 nm to 5 μm on the surface of the p-type silicon substrate 100a and the silicon oxide layer 103 (See FIG. 34). Similarly, a p-type epitaxial silicon layer 110 is deposited to a thickness ranging from 100 nm to 5 μm on the surface of the polycrystalline silicon layer 109 (See FIG. 35). Then, a first semiconductor layer 105 (acting as the source line and the emitter of a selected transistor) is developed as an n-type impurity layer by, e.g., ion injection between any two adjacent silicon oxide layers 103 filling the grooves of the p-type silicon substrate 100a. It is desired that the n-type silicon first semiconductor layer 105 is developed at its impurity volumetric density of $10^{16}$ to $10^{20}/cm^3$. Then, a second semiconductor layer (turned by another patterning process to the word line and the base of the selected transistor) is deposited as a p-type silicon impurity layer on the first semiconductor layer 105 by a similar ion injection. The p-type impurity material implanted in the polycrystalline silicon layer 109 is two to one hundred times faster in the speed of diffusion than that in a mono-crystalline silicon layer. This causes the second semiconductor layer to be composed of a p-type impurity layer 106 in the polycrystalline silicon layer 109, a p-type impurity layer 112 in the silicon substrate 100a, and a p-type impurity layer 114 in the epitaxial silicon layer 110 (See FIG. 36). More specifically, the impurity layers 112 and 114 are developed by the diffusion of impurities from the polycrystalline silicon layer 109 to the mono-crystalline silicon layers respectively and extended by a distance from the polycrystalline silicon layer 109. In other words, the thickness of the second semiconductor layer (the thickness of the word line or the width of the base of the selected transistor) is determined by the thickness of the polycrystalline silicon layer 109. It is desired that the p-type impurity layer 106 is developed at its impurity volumetric density of $10^{16}$ to $10^{19}/$ $cm^3$.

Then, a third semiconductor layer 107 (turned by the another patterning process to the collector of the selected transistor) is deposited as an n-type impurity layer on the p-type impurity layer 114 (See FIG. 36) by a similar ion injection. It is desired that the n-type third semiconductor layer 107 is deposited at its impurity volumetric density of $10^{16}$ to $10^{20}/cm^3$ So long as the first, second, and third semiconductor layers 105, 106, and 107 are optimized in the profile of impurity density corresponding to the target voltage specifications of the bipolar transistor in each memory cell, the order of their developments will be not restricted. Since both the (emitter-base) junction between the p-type impurity layer 112 and the n-type first semiconductor layer 105 and the (collector-base) junction between the p-type impurity layer 114 and the third semiconductor layer 107 are developed in the mono-crystalline layers respectively, their current leakage will favorably be suppressed.

Figure 37A:
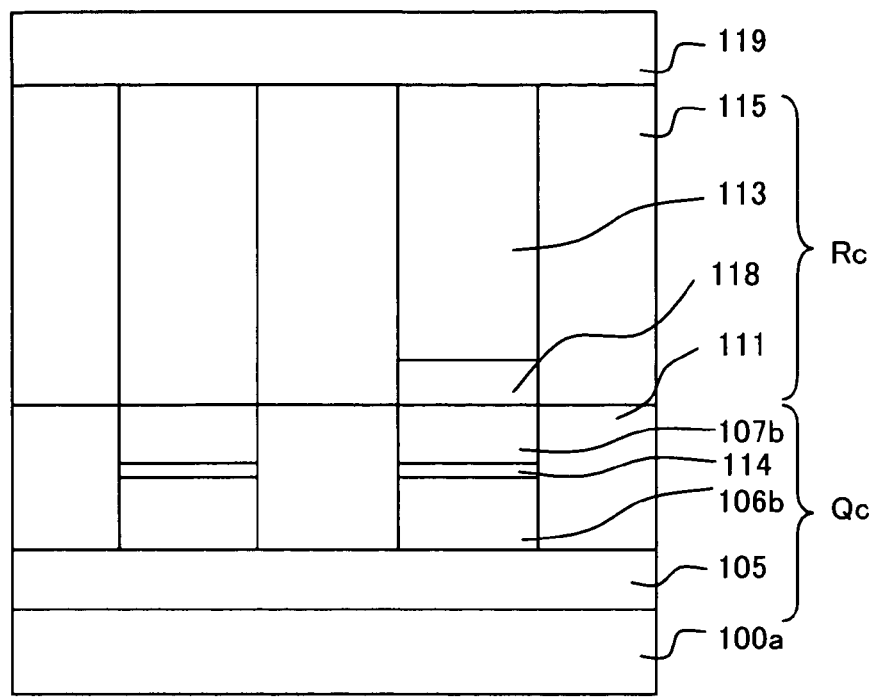
FIG. 37A and FIG. 37B are cross sectional views at a still further step of fabricating the memory cells or the memory array in the method of manufacturing a semiconductor memory device showing the third embodiment of the present invention.
Figure 37B:
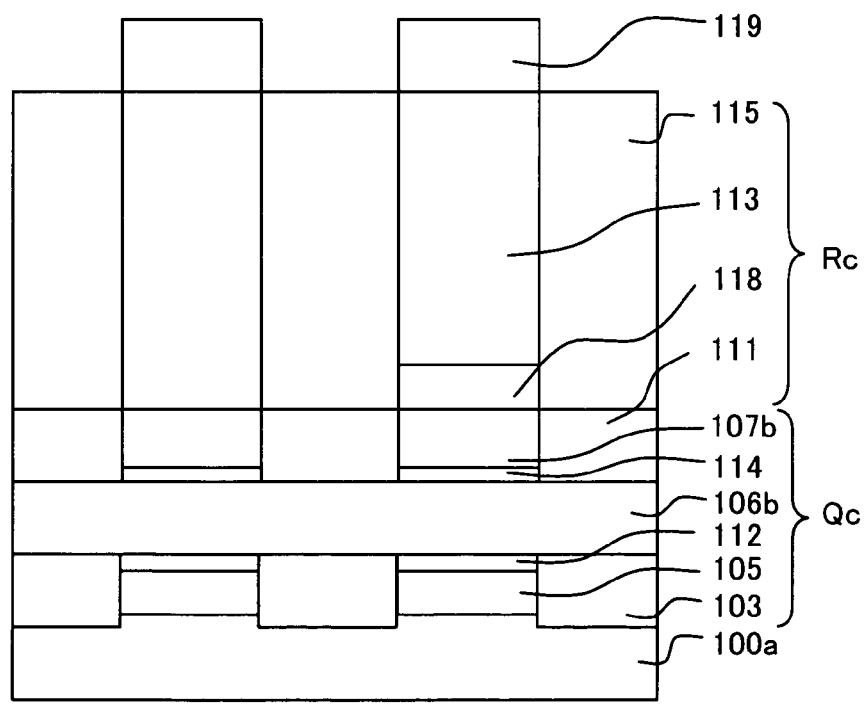
Figure 38:
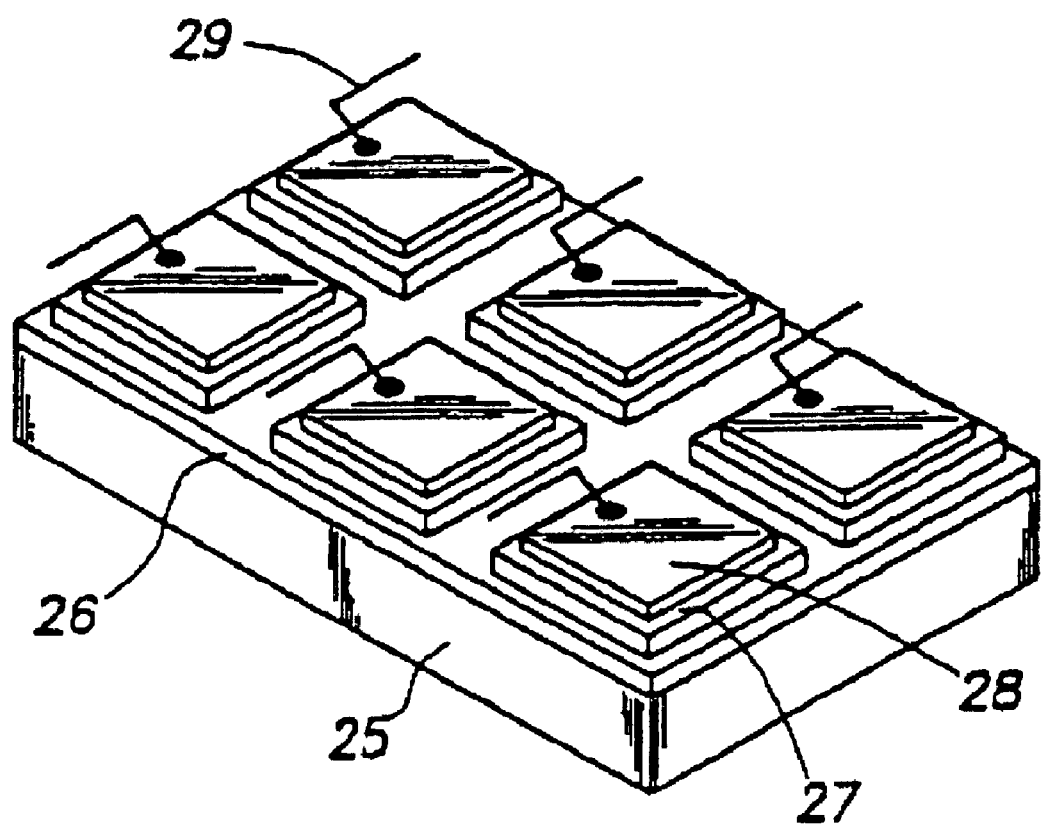
FIG. 38 is a perspective view showing an array of conventional memory cells including the variable resistor elements.
Figure 39:
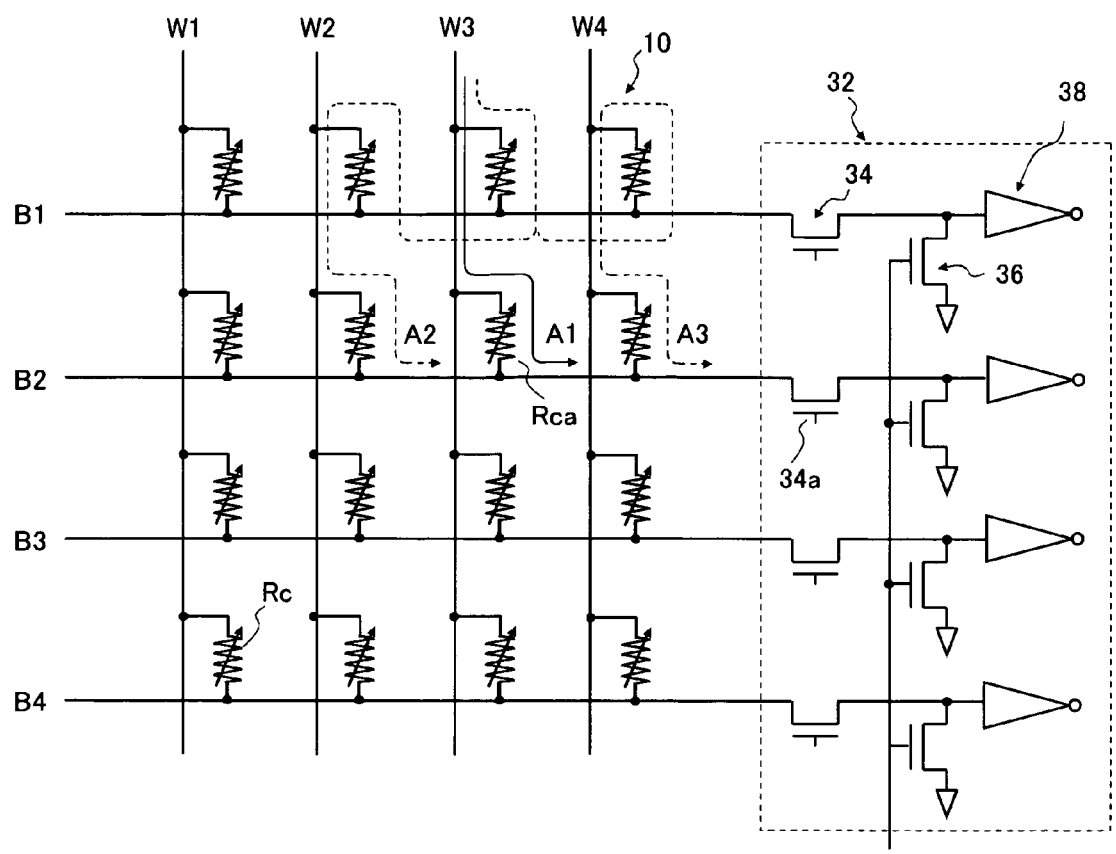
FIG. 39 is a circuitry diagram showing the array of the conventional memory cells including the variable resistor elements.

The steps after the implantation of impurities are identical to those of the first embodiment (as shown in FIGS. 8 to 17). FIG. 37 is a cross sectional view where a pattern of metal wiring (acting as the bit lines) are provided (equal to FIG. 17 of the first embodiment).

As described, the inventive device of this embodiment includes an array of memory cells Mc arranged in a matrix, each memory cell Mc consisting mainly of a variable resistor element Rc, which has a variable resistor body 113 of a perovskite thin film material sandwiched between a first electrode 119 and a second electrode 118, and a transistor element Qc of a bipolar transistor arranged one over the other in a direction equal to the layer direction of the first electrode 119, the variable resistor body 113, and the second electrode 118 in the variable resistor element Rc. As its word line, bit line, and source line are supplied with respective settings of potential, the inventive device can be operated as a nonvolatile semiconductor device for the writing, reading, and resetting actions at a random access mode (a bit-by-bit mode). Also, the application of voltage to the control lines (including the word line) permits a page erasing action to be carried out for each word line.

In addition, it is possible to provide the memory cell Mc capable of operating at lower voltages and being highly integrated, and a semiconductor memory device comprising the memory cells Mc. While the memory cell Mc is being accessed, its neighbor memory cells Mc remain inhibited from generating current leakage thus contributing to the higher operational reliability of the semiconductor memory device. Moreover, the writing, reading, and resetting actions can be conducted at higher speeds.

When the second semiconductor layer acting as the word line in a selected transistor of the bipolar type is a polycrystalline silicon layer, the width of the base of the selected transistor can be determined by the thickness of the polycrystalline silicon layer hence contributing to the ease of designing the selected transistor.

Other Embodiments

Other embodiments of the memory cell, the inventive device, and the inventive method according to the present invention will be described.

Figure 31A:
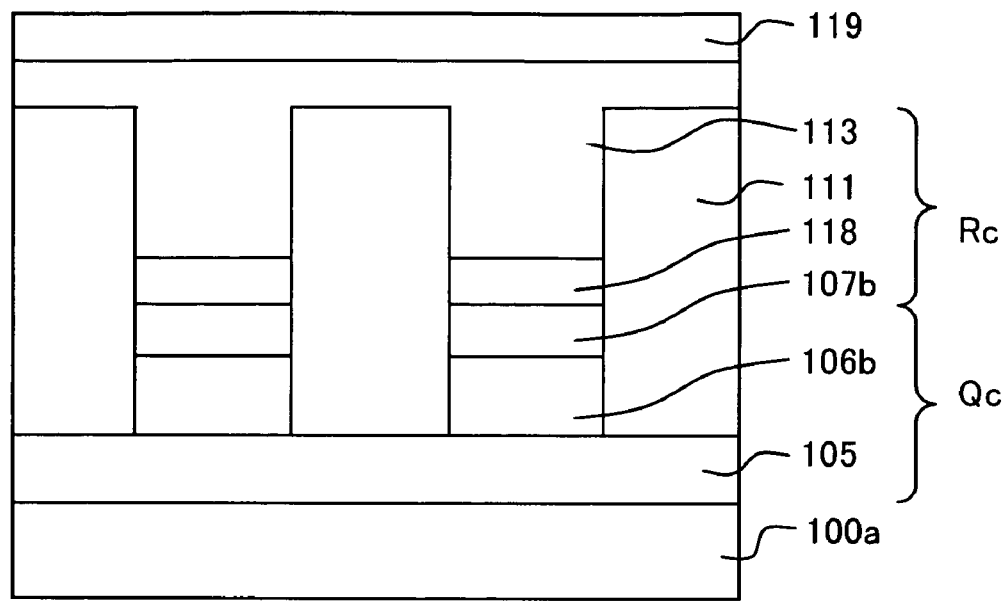
FIG. 31A and FIG. 31B are cross sectional views at a step of fabricating memory cells or a memory array in a method of manufacturing a semiconductor memory device showing a further embodiment of the present invention.
Figure 31B:
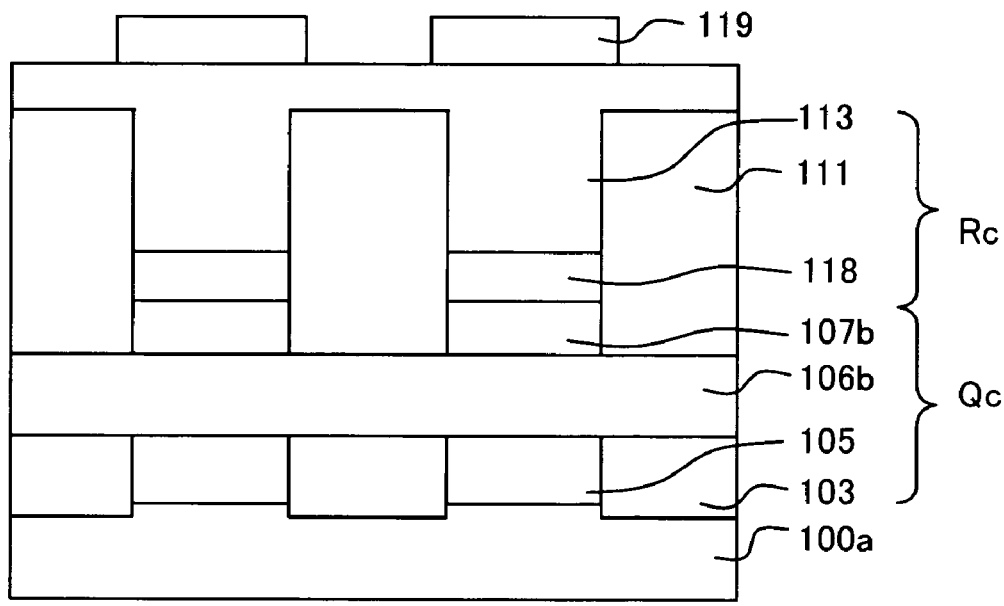

(1) When the resistance of the variable resistor body 113 is high at the initial state in the second embodiment, the insulating layer 111 may be covered entirely or partially with the variable resistor body 113 in the step of having a planer surface of the variable resistor body 113 with the use of a CMP process. FIG. 31 is a cross sectional view showing the structure of a memory cell of this embodiment where the variable resistor body 113 is deposited over an entirety of the insulating layer 111. This may generate current leakage between the variable resistor bodies 113 in any two adjacent memory cells during the action of the memory array. However, the current leakage is as small as negligible because the resistance of the variable resistor bodies 113 is higher, hence producing a minimum interruption to the action and the power consumption of the inventive device.

Figure 32A:
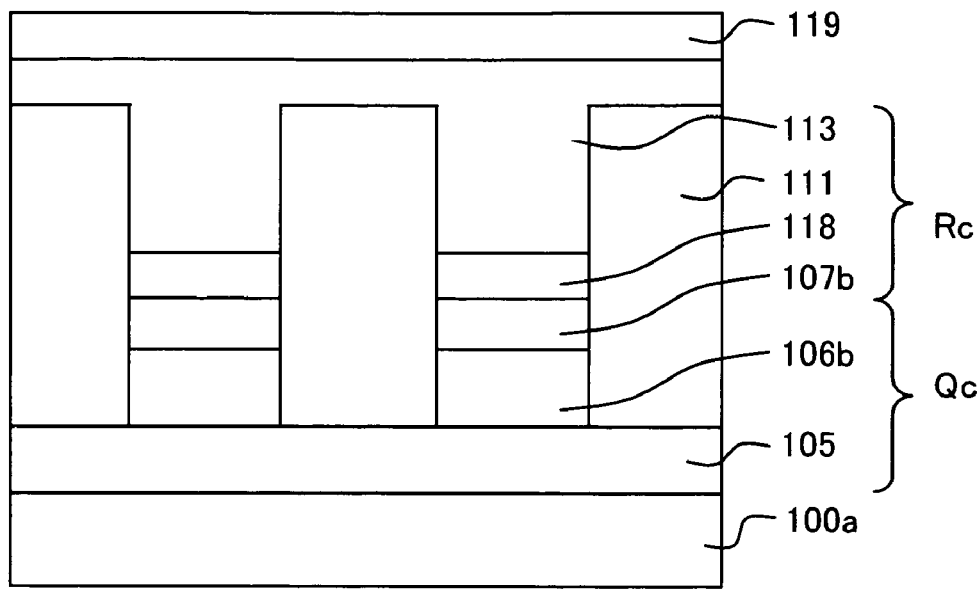
FIG. 32A and FIG. 32B are cross sectional views at a step of fabricating the memory cells or the memory array in the method of manufacturing a semiconductor memory device showing a further embodiment of the present invention.
Figure 32B:
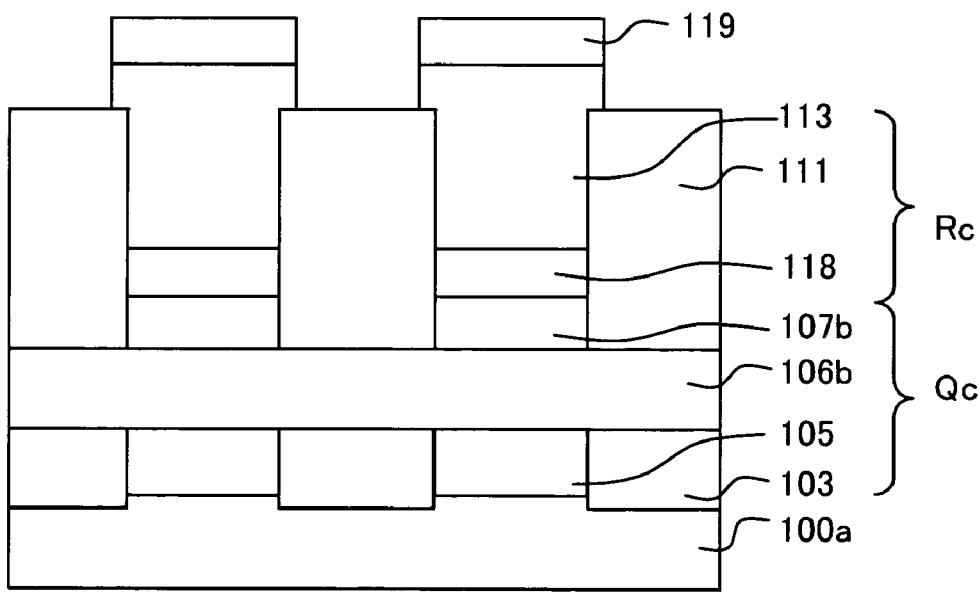

FIG. 32 is a schematic view showing the cross section of the memory array when variable resistor body 113 shown in FIG. 31 is positioned by self-alignment with the first electrode 119. Here, the first electrode 119 is deposited over the variable resistor body 113, and when etching the first electrode 119, the variable resistor body 113 is etched down along with the first electrode 119. However, the variable resistor body 113 remaining on the insulating layer 111 is not separated only between any two adjacent memory cells along the centrifugal direction of the first electrode 119. Since the variable resistor body 113 remains not separated beneath the first electrode 119 at the same potential, any current leakage between the two memory cells will hardly interrupt the action and the power consumption of the inventive device.

(2) In each of the foregoing embodiments, the variable resistor element in each memory cell is made of a perovskite thin film material as described. However, the present invention may also be applied to a memory cell where the variable resistor element is made of another variable resistor element material.

(3) In each of the foregoing embodiments, the memory array includes a 2×2 matrix of memory cells as shown in FIG. 1 for ease of the description. However, the present invention is not limited to a particular size of the memory array.

Although the present invention has been described in terms of the preferred embodiments, it will be appreciated that various modifications and alterations might be made by those skilled in the art without departing from the invention. The invention should therefore be measured in terms of the claims which follow.

What is claimed is:

1. A memory cell in a semiconductor memory device comprising:

a variable resistor element configured so that a variable resistor body is sandwiched between a first electrode and a second electrode, and a transistor element capable of controlling a flow of current in the variable resistor element, wherein the transistor element and the variable resistor element are placed one over the other along a direction in which the first electrode, the variable resistor body, and the second electrode of the variable resistor element are layered, one of the first electrode and the second electrode of the variable resistor element is connected to one electrode of the transistor element;

wherein the variable resistor element is configured so that the variable resistor body is arranged on the second electrode and the first electrode is arranged on the variable resistor body, and the first electrode contains at least one type of material from precious metals in the platinum group metals, single metals selected from Ag, Al, Cu, Ni, Ti, and Ta or alloys of these, oxide conductors selected from Ir, Ru, Re, and Os, and oxide conductors selected from SRO ($SrRuO_3$), LSCO(($LaSr$)$CoO_3$), and YBCO ($YbBa_2Cu_3O_7$).

2. The memory cell according to claim 1, wherein
the transistor element is a bipolar transistor, and
an emitter, a base, and a collector of the bipolar transistor are layered in the same direction as the first electrode, the variable resistor body, and the second electrode of the variable resistor element are layered.

3. The memory cell according to claim 1, wherein the variable resistor body is a metal oxide film.

4. The memory cell according to claim 3, wherein
the material of the variable resistor body is a perovskite-type oxide which contains at least one type of element selected from Pr, Ca, La, Sr, Gd, Nd, Bi, Ba, Y, Ce, Pb, Sm, and Dy and at least one type of element selected from Ta, Ti, Cu, Mn, Cr, Co, Fe, Ni, and Ga.

5. The memory cell according to claim 4, wherein
the perovskite-type oxide is an oxide expressed by any one of the following general formulas (where $0 \leq x < 1$ and $0(z<1)$:
$Pr_{1-x}Ca_x[Mn_{1-z}M_z]O_3$ (where M may be any element selected from Cr, Co, Fe, Ni, and Ga),
$La_{1-x}AE_xMnO_3$ (where AE may be any bivalent alkaline earth metal selected from Ca, Sr, Pb, and Ba),
$RE_{1-z}Sr_xMnO_3$ (where RE may be any trivalent rare earth element selected from Sm, La, Pr, Nd, Gd, and Dy),
$La_{1-x}Co_x[Mn_{1-z}Co_z]O_3$,
$Gd_{1-x}Ca_xMnO_3$, and
$Nd_{1-x}Gd_xMnO_3$.

6. The memory cell according to claim 3, wherein
the material of the variable resistor body is a ZnSe—Ge hetero structure oxide or an oxide which is formed so as to include at least one type of element selected from Ti, Nb, Hf, Zr, Ta, Ni, V, Zn, Sn, In, Th, Al, Pr, Ca, La, Sr, Gd, Nd, Bi, Ba, Y, Ce, Pb, Sm, Dy, Cu, Mn, Cr, Co, Fe, and Ga.

7. A memory cell in a semiconductor memory device comprising:
a variable resistor element configured so that a variable resistor body is sandwiched between a first electrode and a second electrode, and a transistor element capable of controlling a flow of current in the variable resistor element, wherein
the transistor element and the variable resistor element are placed one over the other alone a direction in which the first electrode, the variable resistor body, and the second electrode of the variable resistor element are layered, and
one of the first electrode and the second electrode of the variable resistor element is connected to one electrode of the transistor element,
wherein the variable resistor body is a metal oxide film, and
wherein the second electrode includes at least one type of material from single precious metals in the platinum group metals, alloys based on the precious metal, oxide conductors selected from Ir, Ru, Re, and Os, silicide conductors of an element selected from Ti, Ni, Co, Pt, and W, and oxide conductors selected from SRO($SrRuO_3$), LSCO(($LaSr$)$CoO_3$), and YBCO ($YbBa_2Cu_3O_7$).

8. The memory cell according to claim 1, wherein
the variable resistor element is positioned by self-alignment and connected to one electrode of the transistor element.

9. A semiconductor memory device comprising:
a memory array which has memory cells arranged in a matrix of rows and columns on a semiconductor substrate, wherein
the transistor element in the memory cell is a bipolar transistor,
the memory cell is configured so that one of the first electrode and the second electrode of the variable resistor element is connected to one of the emitter and the collector of the bipolar transistor, and
the memory array is configured so that the other of the emitter and the collector of the bipolar transistor in each of the memory cell of each column is connected to a common source line which extends along the column, the base of the bipolar transistor in each of the memory cell of each row is connected to a common word line which extends along the row, and the other of the first electrode and the second electrode of the variable resistor element in each of the memory cell of each column is connected to a common bit line which extends along the column,
wherein the memory cells comprises
a variable resistor element configured so that a variable resistor body is sandwiched between a first electrode and a second electrode, and a transistor element capable of controlling a flow of current in the variable resistor element, wherein
the transistor element and the variable resistor element are placed one over the other along a direction in which the first electrode, the variable resistor body, and the second electrode of the variable resistor element are layered, and
one of the first electrode and the second electrode of the variable resistor element is connected to one electrode of the transistor element
wherein the source line is formed by a stripe of p-type or n-type semiconductor layer deposited on the semiconductor substrate, the word line is formed by a stripe of semiconductor layer with the different conduction type from the source line which is deposited on the source line, and the base/emitter junction or the base/collector junction of the bipolar transistor of each of the memory cells is formed on the contact surface of the source line and the word line at the intersection of the source line and the word line.

10. The semiconductor memory device according to claim 9, wherein
one of the emitter and the collector of the bipolar transistor which is connected with either the first electrode or the second electrode of the variable resistor element in each of the memory cells is formed by a semiconductor layer with the same conduction type as the source line which is deposited on the word line at each of the intersection of the source line and the word line,
the variable resistor element in each of the memory cells is formed above the one of the emitter and the collector of the bipolar transistor which is connected with either the first electrode or the second electrode of the variable resistor element at each of the intersection of the source line and the word line, and the bit line is formed above the variable resistor element.

11. The semiconductor memory device according to claim 10, wherein
the variable resistor element in each of the memory cells is formed by self-alignment above the one of the emitter and the collector of the bipolar transistor which is connected with either the first electrode or the second electrode of the variable resistor element at each of the intersection of the source line and the word line, and the bit line is formed above the variable resistor element.

12. The semiconductor memory device according to claim 10, wherein
the bit line is connected to the variable resistor element with a contact electrically connected by self-alignment to the variable resistor element.

13. The semiconductor memory device according to claim 9, wherein
each electrode of the bipolar transistor and the first electrode, the variable resistor body, and the second electrode of the variable resistor element are placed one over another in a direction vertical to a surface of the semiconductor substrate.

* * * * *

UNITED STATES PATENT AND TRADEMARK OFFICE
CERTIFICATE OF CORRECTION

| | |
|---|---|
| PATENT NO. | : 7,602,026 B2 |
| APPLICATION NO. | : 11/474414 |
| DATED | : October 13, 2009 |
| INVENTOR(S) | : Horii et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 531 days.

Signed and Sealed this

Fifth Day of October, 2010

David J. Kappos
*Director of the United States Patent and Trademark Office*